United States Patent [19]

Booth et al.

[11] Patent Number: 5,402,514
[45] Date of Patent: Mar. 28, 1995

[54] OPTICAL WAVEGUIDE DEVICES INCLUDING DRY PHOTOHARDENABLE LAYERS

[75] Inventors: Bruce L. Booth, West Chester; Joseph E. Marchegiano, Landenberg, both of Pa.

[73] Assignee: E. I. Du Pont de Nemours and Company, Wilmington, Del.

[21] Appl. No.: 177,871

[22] Filed: Jan. 5, 1994

Related U.S. Application Data

[60] Division of Ser. No. 45,280, Apr. 8, 1993, Pat. No. 5,292,620, which is a continuation of Ser. No. 297,641, Jan. 13, 1989, abandoned, which is a continuation-in-part of Ser. No. 144,003, Jan. 15, 1988, abandoned.

[51] Int. Cl.$^6$ .............. G02B 6/12; G02B 6/22; G02B 6/34
[52] U.S. Cl. .................. 385/130; 385/14; 385/15; 385/31; 385/37; 385/39; 385/45; 385/49; 385/50; 385/129; 385/131; 385/132; 385/141; 385/143; 385/145
[58] Field of Search .............. 385/14, 15, 27, 28, 385/30, 31, 37, 39, 41, 42, 45, 49, 50, 51, 52, 129, 130, 131, 132, 141, 143, 145

[56] References Cited

U.S. PATENT DOCUMENTS

| | | | |
|---|---|---|---|
| 3,526,504 | 9/1970 | Celeste | 385/130 X |
| 3,658,526 | 4/1972 | Haugh | 430/1 |
| 3,674,336 | 7/1972 | Kogelnik | 385/130 X |
| 3,689,264 | 9/1972 | Chandross et al. | 385/130 X |
| 3,809,686 | 5/1974 | Chandross et al. | 385/130 X |
| 3,809,732 | 5/1974 | Chandross et al. | 385/130 X |
| 3,955,015 | 5/1976 | Ohtsuka et al. | 264/1.5 X |
| 3,993,485 | 11/1976 | Chandross et al. | 385/141 X |
| 4,017,158 | 4/1977 | Booth | 359/567 X |
| 4,472,020 | 9/1984 | Evanchuk | 385/14 X |
| 4,609,252 | 9/1986 | Wong et al. | 385/129 X |
| 4,637,681 | 1/1987 | Yamamoto et al. | 385/33 X |
| 4,666,236 | 5/1987 | Mikami et al. | 385/51 X |
| 4,691,982 | 9/1987 | Nishimura et al. | 385/37 X |
| 4,712,854 | 12/1987 | Mikami et al. | 385/143 X |
| 4,749,245 | 6/1988 | Kwatsuki et al. | 385/130 X |
| 4,838,634 | 6/1989 | Bennion et al. | 385/122 X |
| 4,883,743 | 11/1989 | Booth et al. | 385/50 X |
| 5,015,059 | 5/1991 | Booth et al. | 385/49 X |
| 5,016,958 | 5/1991 | Booth | 385/16 X |
| 5,026,135 | 6/1991 | Booth | 385/130 X |
| 5,045,397 | 9/1991 | Jensen | 385/130 X |
| 5,062,681 | 11/1991 | Furmanak et al. | 385/50 |
| 5,098,804 | 3/1992 | Booth | 385/16 X |
| 5,150,440 | 9/1992 | Booth | 385/49 |
| 5,224,197 | 6/1993 | Zanoni et al. | 385/130 |
| 5,265,185 | 11/1993 | Ashley | 385/132 |
| 5,292,620 | 3/1994 | Booth et al. | 385/141 X |

FOREIGN PATENT DOCUMENTS

| | | | |
|---|---|---|---|
| 2553924 | 8/1976 | Germany | 385/130 X |
| 65581 | 6/1972 | Luxembourg | 385/130 X |
| 2191603 | 12/1987 | United Kingdom | 385/130 X |

OTHER PUBLICATIONS

B. L. Booth, "Photopolymer Material for Holography," Applied Optics, vol. 14, No. 3, Mar. 1975, pp. 593–601.

E. A. Chandross and C. A. Pryde, "Photolocking—A new technique for fabricating optical waveguide circuits," Appl. Phys. Lett., vol. 24, No. 2, Jan. 15, 1974, pp. 72–74.

W. C. Colburn and K. A. Haines, "Volume Hologram Formation in Photopolymer Materials," Applied Optics, vol. 10, No. 7, Jul. 1971, pp. 1636–1641.

H. Kamogawa, H. Koizumi, and M. Nanasawa, "Synthesis of N—Substituted Carbazoles Involving Photopolymerizable Terminal Vinyl Groups," Journal of Polymer Science, Polymer Chemistry Edition, vol. 18, 1979, pp. 9–18.

(List continued on next page.)

*Primary Examiner*—Brian Healy
*Attorney, Agent, or Firm*—John E. Griffiths

[57] ABSTRACT

Optical waveguide devices for interconnecting optical fibers and use in integrated optical systems. The invention includes a substantially dry method for making the devices and intermediate elements.

31 Claims, 13 Drawing Sheets

OTHER PUBLICATIONS

W. J. Tomlinson, E. A. Chandross, H. P. Weber, G. D. Aumiller, "Multicomponent photopolymer systems for volume phase holograms and grating devices," Applied Optics, vol. 15, No. 2, Feb. 1976, pp. 534–541.

W. J. Tomlinson, I. P. Kaminow, E. A. Chandross, R. L. Fork, and W. T. Silfvast, "Photoinduced Refractive Index Increase, In Poly(Methylmethacrylate) and Its Applications," Applied Physics Letters, vol. 16, No. 12, Jun. 15, 1970, pp. 486–489.

K. Tsutsumi, Y. Imada, H. Hirai, and Y. Yuba, "Analysis of Single-Mode Optical Y-Junctions by the Bounded Step and Bend Approximation," Journal of Lightwave Technology, vol. 6, No. 4, Apr. 1988, pp. 590–600.

R. Th. Kersten, "Modified Thick Film Technology for Multimode Integrated Optics," Optics Communications, vol. 28, No. 1, Jan. 1979, pp. 51–54.

F. Auracher, "Planar Branching Network for Multimode Glass Fibers," Optics Communications, vol. 17, No. 1, Apr. 1976, pp. 129–132.

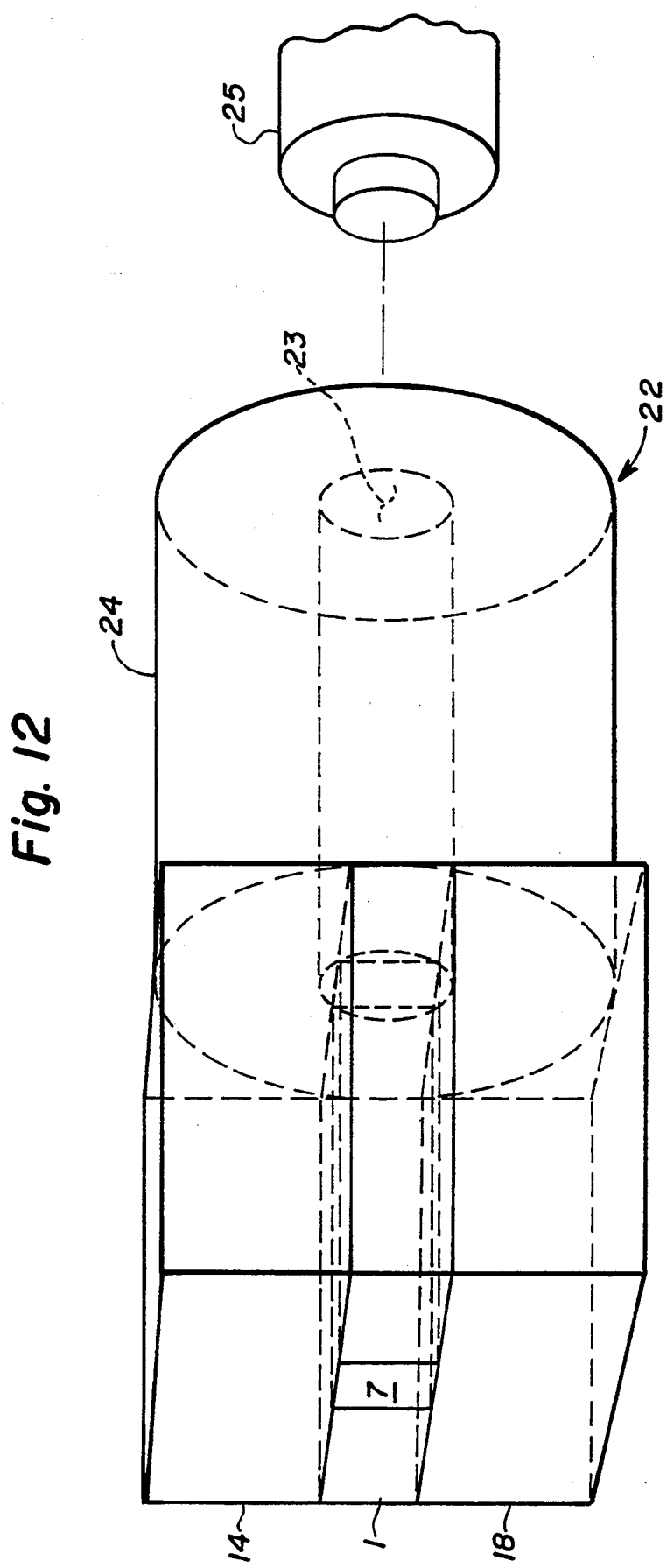

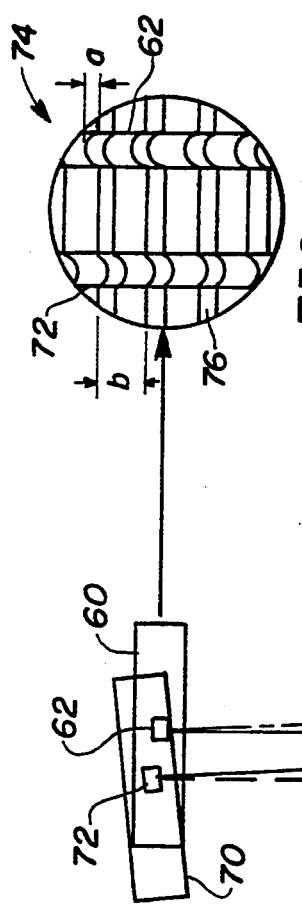
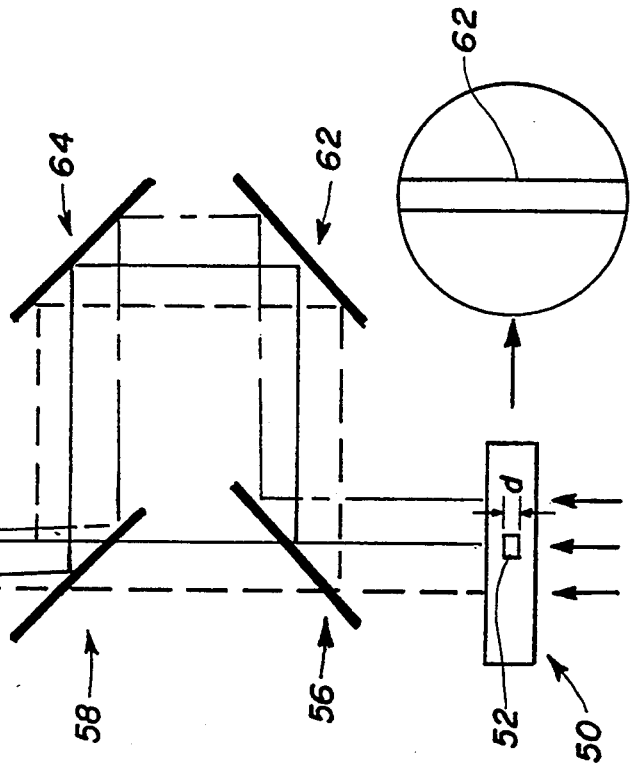
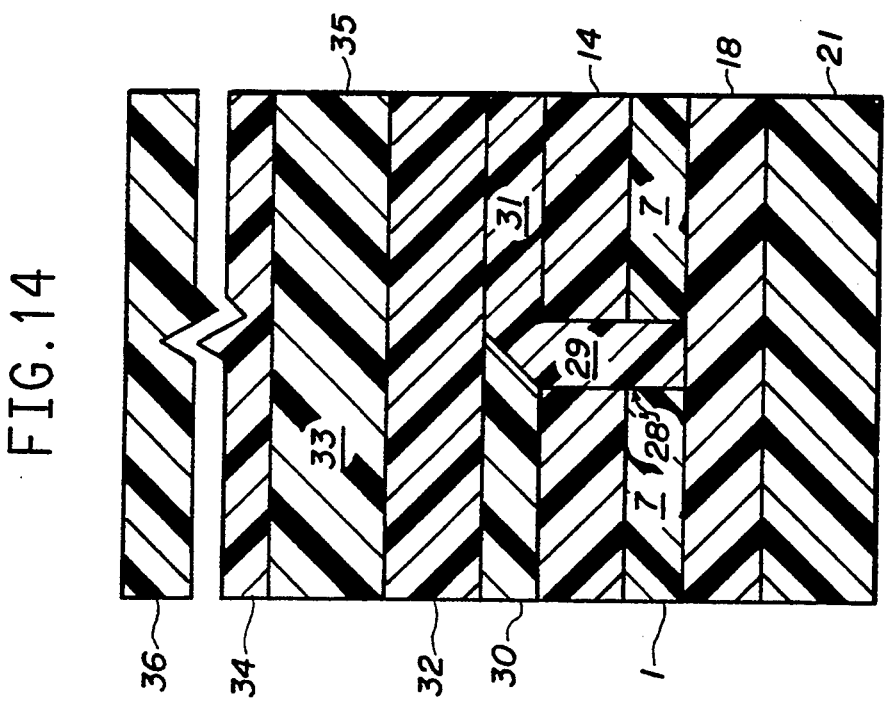

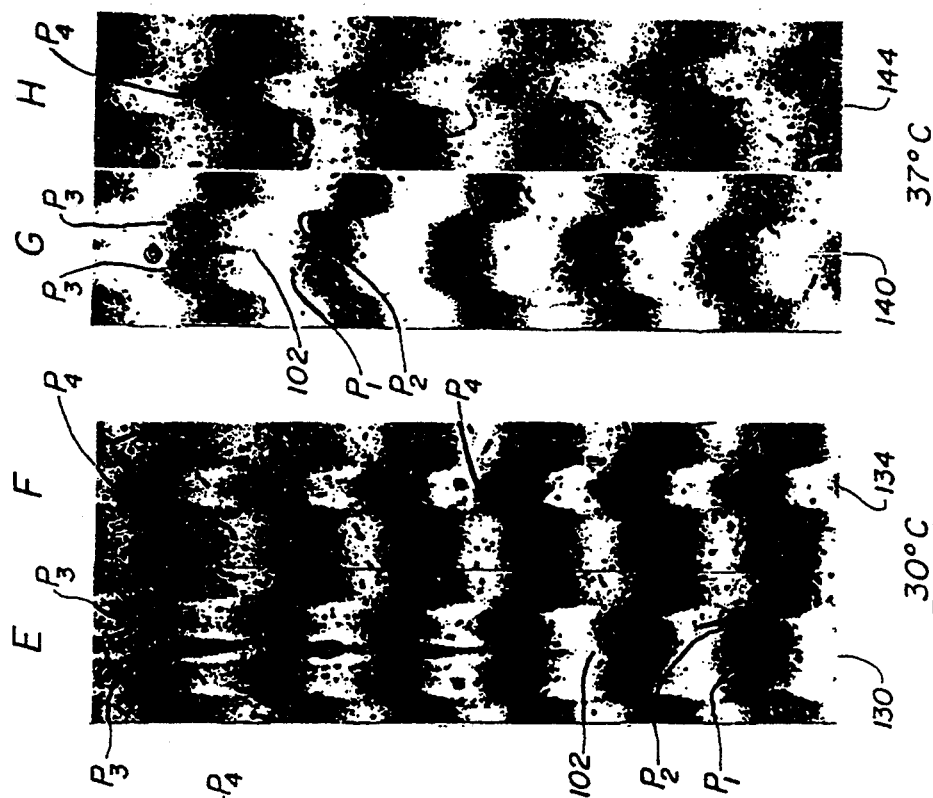
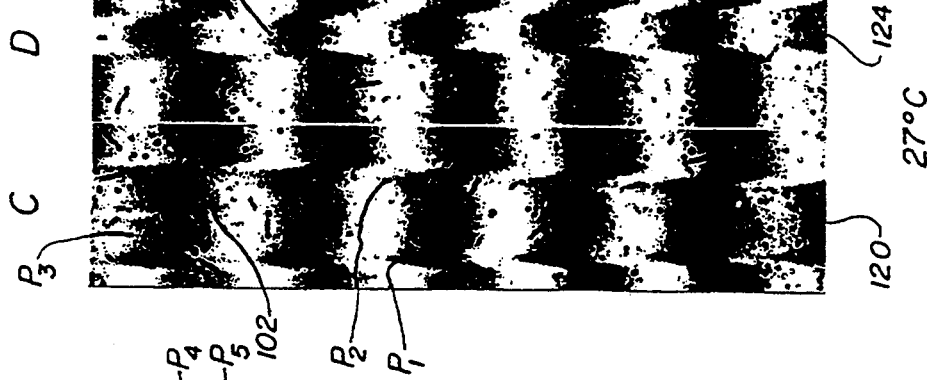
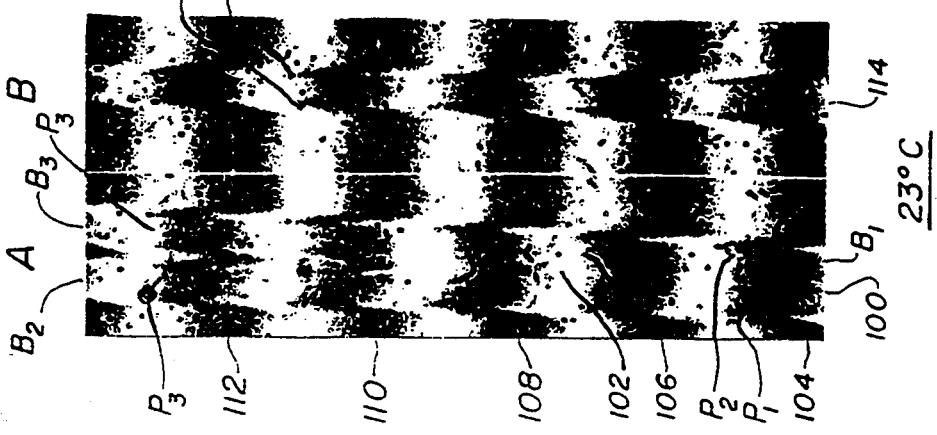
FIG. 18A  FIG. 18B  FIG. 18C  FIG. 18D
EXPOSURE TEMP.

OPTICAL WAVEGUIDE DEVICES INCLUDING DRY PHOTOHARDENABLE LAYERS

CROSS-REFERENCES TO RELATED APPLICATIONS

This is a division of application Ser. No. 08/045,280, filed Apr. 8, 1993, now U.S. Pat. No. 5,292,620, which is a continuation of application Ser. No. 07/297,641, filed Jan. 13, 1989, now abandoned, which is a continuation-in-part application of U.S. patent application Ser. No. 07/144,003, filed Jan. 15, 1988, now abandoned.

BACKGROUND OF THE INVENTION

1. Field of the Invention

This invention relates to optical waveguide devices, elements for making the devices and methods of making the devices and elements. The devices are for interconnecting optical fibers, optical components and modules and for use in integrated optical systems.

2. Description of the Prior Art

In optical communication systems, messages are transmitted by carrier waves of optical frequencies that are generated by sources such as lasers or light-emitting diodes. There is much current interest in such optical communication systems because they offer several advantages over conventional communication systems, such as having a greatly increased number of channels of communication and the ability to use other materials besides expensive copper cables for transmitting messages. One such means for conducting or guiding waves of optical frequencies from one point to another is called an optical waveguide. The operation of an optical waveguide is based on the fact that when a medium which is transparent to light is surrounded or otherwise bounded by another medium having a lower refractive index, light introduced along the inner medium's axis is highly reflected at the boundary with the surrounding medium, thus, producing a guiding effect. The most frequently used material for such a waveguide device is glass, which is formed into a fiber of specified dimensions.

As the development of optical circuits proceeded, it became necessary to have devices which could couple, divide, switch and modulate the optical waves from one waveguide fiber to another.

Some optical fibers are interconnected by other optical fibers cut to length. These devices have only two terminals—one at each end. Photohardened films containing a waveguide have been proposed for this use, such as in U.S. Pat. No. 3,809,732. However, the device disclosed therein isn't easily coupled to and aligned with an optical fiber. Further, due to the uneven surface of its film, one cannot easily protect its exposed surface from the environment.

Another method used to form an optical coupling device involves the application of standard photolithographic processes and diffusion. By this prior art process, standard lithographic processes are used to define a pattern in a photoresist layer deposited on a chosen substrate. Then, an etchant is applied to etch the photoresist-defined pattern into the substrate. Next, a metal is deposited in the etched region by vacuum deposition. The photoresist pattern is then lifted off with an appropriate solvent, carrying with it unwanted metal deposits. The structure is then heated to diffuse the metal deposited in the etched region into the substrate, to form a waveguiding layer therein. See, for instance, U.S. Pat. No. 4,609,252. In addition to the fact that many steps are involved in such a process, there is also a limitation on the thickness of the metal which may be deposited. First, since vacuum deposition is a relatively slow process, there is the limitation of the excessive amount of time required to deposit a thick layer of metal. Secondly, as more and more metal is deposited, new centers for deposition are created, resulting in an uneven deposit.

To form branches, two or more fibers have been bonded to a common optical port using an adhesive having an index of refraction closely matched to that of the fibers. The fibers are very small in diameter and must be handled with extreme care, bundled together for strength, and attached to a support at intervals. Fabrication of the equivalent of a printed circuit board comprised of these discrete fibers and optical devices is labor-intensive, expensive, slow and tedious, and not readily adapted to automated fabrication techniques. Another method used to form such a coupler is to fuse or melt fibers together so that light from one fiber can pass to the connected fibers. However, in such a fusion process it is difficult to control the extent of fusion and the exact geometry and reproducability of the final structure.

A device of particular interest is the "Y-coupler", which is a "y"-shaped device that couples signals together or divides them apart. "Y"-shaped devices have been made in a wet process by exposing a liquid photoactive layer to ultraviolet radiation through a mask. Then a solvent is used to remove the unpolymerized portions of the layer. See, for instance, U.S. Pat. No. 4,609,252. The waveguide of this device, like those mentioned above, isn't protected from the environment or readily coupled to an optical fiber. Further, being a wet process, it has the tendency of being messy and the problem of disposing of the spent solvent.

Another "Y"-shaped coupler device is disclosed in U.S. Pat. No. 4,666,236. It further discloses a device with one input branch and three output branches. These devices are also made by a wet process exposing a liquid photopolymer film to light to create a waveguide. The unexposed liquid film is dried and becomes part of the device. The film is further coated with a layer, such as an acrylic resin, to prevent deposition of dust and staining. Again, this process is wet and, thus, inherently messy.

A further disadvantage of prior art couplers is that power and light intensity is lost when light passes through them, particularly through devices with abrupt-bends with large branching angles due to scattering of light at the intersection of the branches. Tsutsumi et al., (J. Lightwave Technol., LT-6, pages 590–600, 1988) have shown that the transmitted power of a Y-coupler will deteriorate rapidly as the branching angle increases above one degree.

U.S. Pat. No. 3,809,686 shows waveguides created in a single photopolymer film by focusing a beam of light within the film and moving the film. It shows multiple waveguides in a single film. In one embodiment, the waveguides exhibit evanescent coupling of light between the waveguides. It further teaches the creation and use of holographic diffraction gratings as light couplers. However, it is difficult to focus light within a film to form a homogenous waveguide with clear and distinct boundaries.

An object of this invention is to provide an improved method of forming conductors of light for interconnecting optical components and modules. These light conductors may be formed with a plurality of branches and terminals.

A further object of this invention is to provide improved optical waveguide devices, elements for making the devices and methods of making the devices and elements.

Another object of this invention is to provide an optical waveguide device including at least one high diffraction efficiency volume phase grating.

Another object of this invention is to provide a low power and light intensity loss splitter and reverse splitter.

SUMMARY OF THE INVENTION

The general purpose of this invention is to provide new and improved optical waveguide structures having predetermined geometry and to provide the process for forming these structures, which possess most, if not all, of the advantages of the prior art devices and processes while alleviating their significant disadvantages discussed above.

In order to accomplish the above-described general purpose of this invention, the present invention comprises a substantially dry method of making an optical waveguide device with at least one buried channel waveguide in a laminated and hardened matrix. The steps include:

exposing to light at least a first region of a substantially dry photohardenable film having first and second surfaces, with a support removably adhered to the first surface, polymerizing at least one monomer in the film and changing the refractive index in the region to form at least a first optical waveguide;

laminating a first surface of a first substantially dry photohardenable layer to the film second surface, with a support removably adhered to a second surface of the first layer;

removing the support from the film first surface;

laminating a first surface of a second substantially dry photohardenable layer to the film first surface, with a support removably adhered to a second surface of the second layer; and hardening the layers and film forming a hardened matrix, substantially fixing the indexes of refraction of the layers and the film, and creating at least one buried waveguide.

The present invention is also directed to optical waveguide elements for use in creating optical waveguide devices comprising the elements resulting from each step of the method of the present invention until an optical waveguide device is formed.

One such optical waveguide element comprises:
a film having first and second surfaces, the film having a first photohardened region adapted to transmit light as an optical waveguide and substantially dry photohardenable remaining regions; and
a support removably adhered to the first surface.

Another such optical waveguide element includes:
a photohardened film having first and second substantially flat surfaces, the film having a first region and remaining regions, the first region adapted to transmit light as an optical waveguide; and
a support removably adhered to the first surface.

The present invention further includes optical waveguide devices for use in integrated optical systems. One such device comprises:
a photohardened film having first and second surfaces, the film having a first region and remaining regions, the first region adapted to transmit light as an optical waveguide;
a first photohardened layer having first and second surfaces, the first layer first surface laminated on the film first surface covering a first side of the waveguide; and
a second photohardened layer having first and second surfaces, the second layer first surface laminated on the film second surface covering a second side of the waveguide.

The present invention is further directed to an optical waveguide for guiding light, the waveguide having at least a bilobal refractive index profile.

BRIEF DESCRIPTION OF THE DRAWINGS

The invention may be more fully understood from the following detailed description thereof taken in connection with accompanying drawings which form a part of this application and in which:

FIG. 12 shows a buried channel waveguide device coupled to an optical fiber with light being injected through the fiber and waveguide.

FIG. 14 is a cross sectional view of a laminated device having a film, multiple layers, an end support, waveguides and a grating.

FIGS. 15a–c is a schematic representation of the operation of a shearing interference microscope.

FIGS. 18A–D are reproductions of photographs taken of portions of images of the devices of Examples 3–6 viewed in a shearing interference microscope.

DESCRIPTION OF THE PREFERRED EMBODIMENTS

Figure 1:
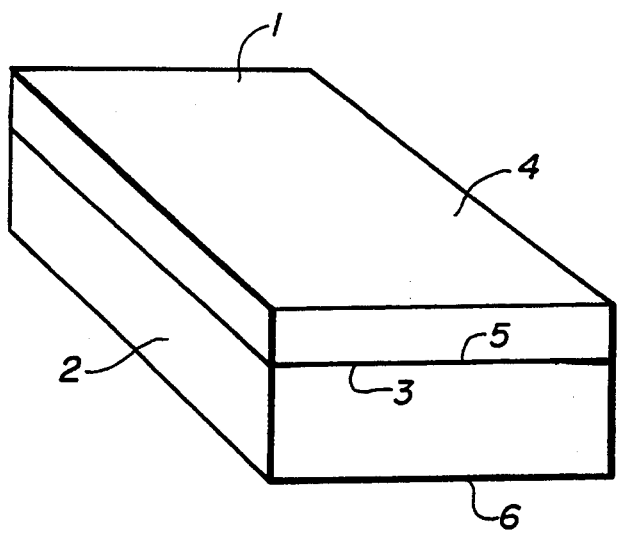
FIG. 1 is a perspective view of a photohardenable film removably adhered to a support.

Throughout the following detailed description, similar reference numerals refer to similar elements in all Figures of the drawings.

Referring to FIG. 1, an element used in the method of the present invention is illustrated comprising a substantially dry photohardenable film 1 removably adhered to a support 2. The film 1 has a first surface 3 and a second surface 4. The support similarly has a first surface 5 and a second surface 6. The first surface 5 of the support 2 is removably adhered to the first surface 3 of the film 1. In a preferred embodiment, the surfaces 3, 4, 5 and 6 of the film 1 and the support 2 are substantially flat.

The film 1 may have a thickness in the range of 2 micrometers through 15 micrometers or above, preferably in the range of 4.5 micrometers through 8.0 micrometers, and more preferably about 5.3 micrometers.

Figure 2A:
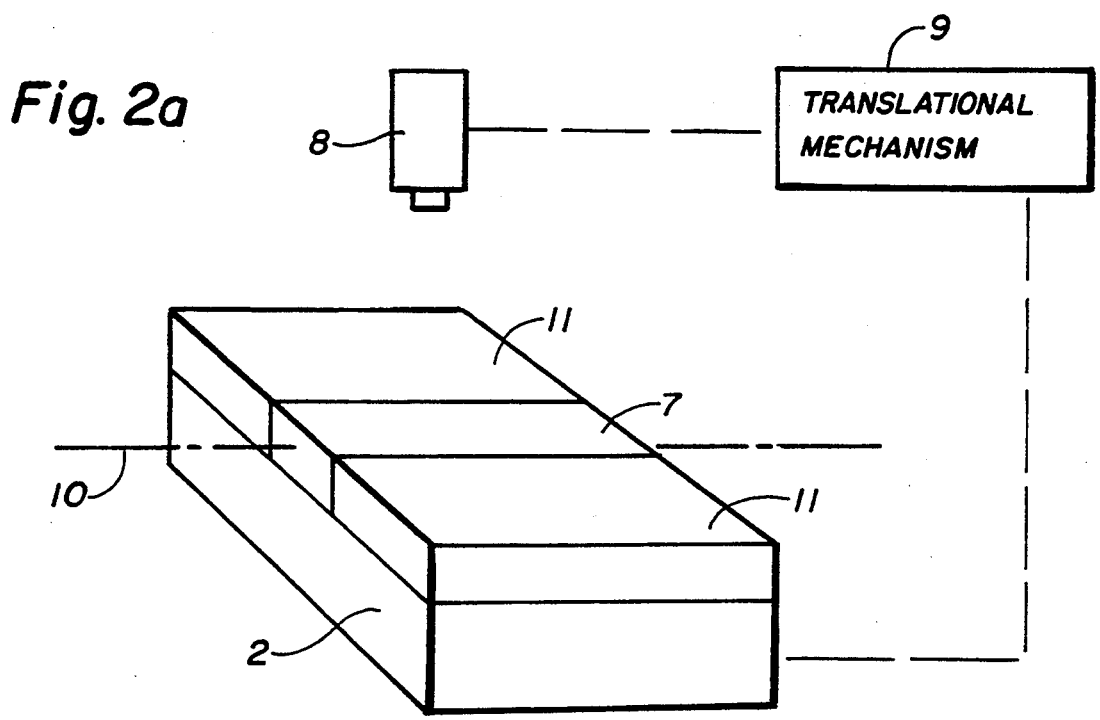
FIG. 2a is a schematic representation of a first embodiment for forming an optical waveguide element comprising a waveguide in a film on a support.
Figure 2B:
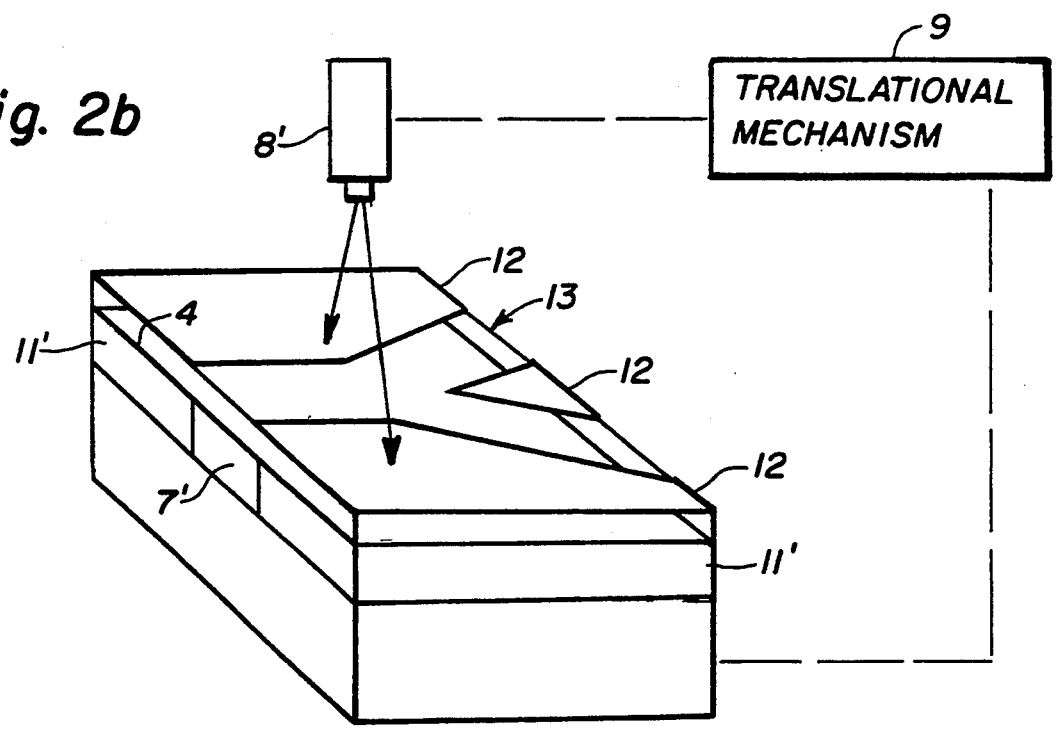
FIG. 2b is a schematic representation of a second embodiment for forming an optical waveguide element comprising a waveguide in a film on a support.
Figure 2C:
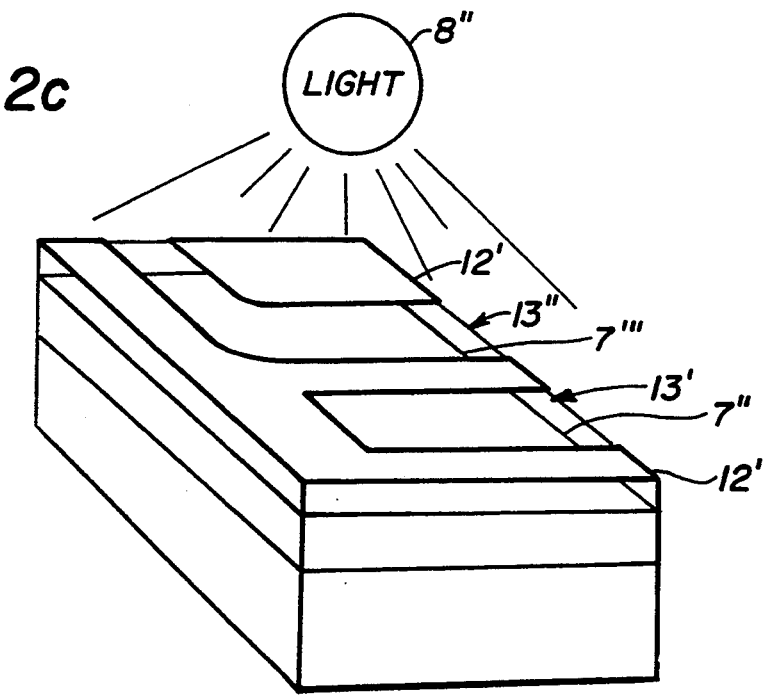
FIG. 2c is a schematic representation of a third embodiment for forming an optical waveguide element comprising a waveguide in a film on a support.

Referring to FIGS. 2a, 2b and 2c, the first step of the method of the present invention comprises exposing to light at least a first region 7 of the film 1 polymerizing at least one monomer in the film 1 and changing the refractive index of the region 7 to form at least a first optical waveguide. The term waveguide is defined by those skilled in this art to include the entire area that transmits radiant energy. This technically includes some area just around the exposed region. However, for simplicity, the exposed region can be considered to substantially be the waveguide. In theory, the waveguide formation is believed to be due to a self-focusing property of the film material. Upon exposure to light, a polymerization reaction is induced in the exposed region. It is believed that there is interdiffusion between the exposed and unexposed regions, at least near the interface of these regions. This interdiffusion changes and typically increases the density of the exposed region raising its refractive index creating a lens-like exposed region directing the light in a self focused fashion to create a narrow smooth walled waveguide of approximately the same dimension as a mask area or light beam width. Three embodiments for performing this first step are illustrated in FIGS. 2a, 2b and 2c.

In FIG. 2a, a focused laser light source 8 exposes the region 7 to form the waveguide. A translational mechanism 9 is connected to the laser light source 8 and/or the support 2 for moving the laser light source 8, the support 2 or both, to create the waveguide having a desired and/or predetermined pattern. Here, the exposed region 7 has a substantially elongated box configuration having an optical axis 10 through the longitudinal center of the region 7. A physical cross section of the exposed region 7 perpendicular to the optical axis 10 is substantially rectangular. On both sides of the region 7 are remaining unexposed regions 11 of the film 1.

FIG. 2b shows an alternate embodiment for exposing a region 7'. Here, a non-focused laser light source 8' is generally directing actinic radiation toward the element of FIG. 1. An opaque mask 12 is positioned between the laser light source 8' and the film 1, typically contacting and covering the second film surface 4. The mask 12 has at least a patterned area 13 therein through which actinic radiation from the light source 8' exposes region 7'. The patterned area can have any desired configuration, including the substantially Y configuration shown in FIG. 2b. Exposing the region 7' through this area 13 results in the creation of a waveguide having a substantially Y configuration. Described more generically, the region can have one end adapted to inlet or outlet light connected to a plurality of ends (e.g., 2, 3, 4 . . . ) adapted to inlet or outlet light. As in the FIG. 2a embodiment, there are remaining unexposed regions 11' in the film 1.

A third embodiment for performing the exposing step of the present method is illustrated in FIG. 2c. Here, actinic radiation from a light source 8'' exposes a first region 7'' and a second region 7''' of the film 1 through an opaque mask 12'. This mask 12' has first and second areas 13' and 13'' for the light to pass through exposing regions 7'' and 7''', respectively. The second area 13'' approaches and is in part parallel to the first area 13'. Thus, after exposure, the exposed second region 7''' and the corresponding waveguide approaches and is in part parallel to the exposed first region 7'' and the corresponding waveguide. As a result, the waveguides can be positioned to exhibit evanescent coupling of light injected into one of the waveguides by gradually leaking or coupling the injected light into the other waveguide.

In each of these preferred embodiments, after exposure, the first and second surfaces 3 and 4 of the film 1 remain substantially flat. This facilitates subsequent laminating of layers on the film surfaces. As such, FIGS. 2a, 2b and 2c illustrate the making of optical waveguide elements in accordance with this invention useful in making optical waveguide devices which in turn are useful in integrated optical systems.

Figure 3:
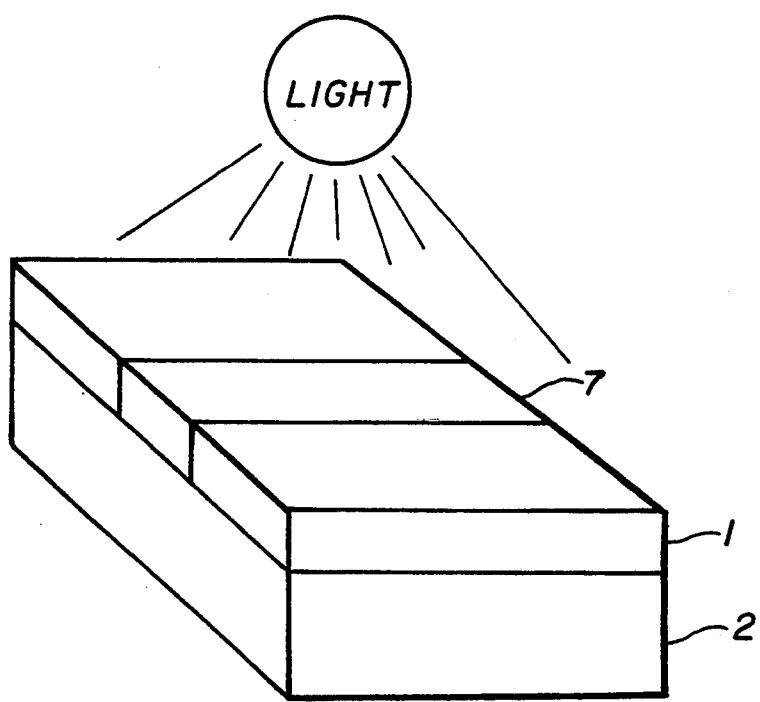
FIG. 3 depicts an optional step of flooding the film having a waveguide on a support with light resulting in an element.

FIG. 3 illustrates an optional step which follows the exposing step. The element resulting from the exposure step can be flooded with light, such as broadband ultraviolet light. This polymerizes some of at least one monomer in the film and typically most or all of one or all of the monomers in the film. This may allow for easy removal or attachment of the support 2. This resulting optical waveguide element can similarly be used in making optical waveguide devices in accordance with the method of this invention.

Figure 4:
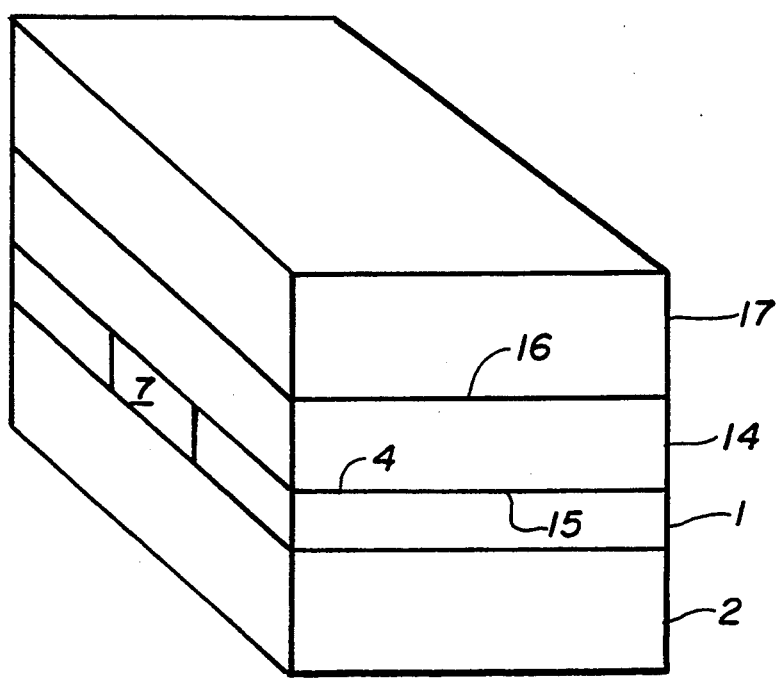
FIG. 4 shows a laminated element comprising from top to bottom a support, a photohardenable layer, a film having a waveguide, and another support.

Next, referring to FIG. 4, a first substantially dry photohardenable layer 14 is laminated to the second film surface 4. The first layer 14 has first and second surfaces 15 and 16, respectively. The first layer 14 first surface 15 is laminated to the second film surface 4 by placing them in intimate contact and controllably applying pressure with rollers to remove air between the film 1 and layer 14. The first layer 14 is tacky. If the optional flooding step illustrated in FIG. 3 is not performed, then the film 1 is also tacky. Thus, the film 1 and first layer 14 easily adhere to one another. A support 17 is removably adhered to the second surface 15 of the first layer 14. FIG. 4 illustrates another optical waveguide element in accordance with the present invention useful in making optical waveguide devices.

Figure 5:
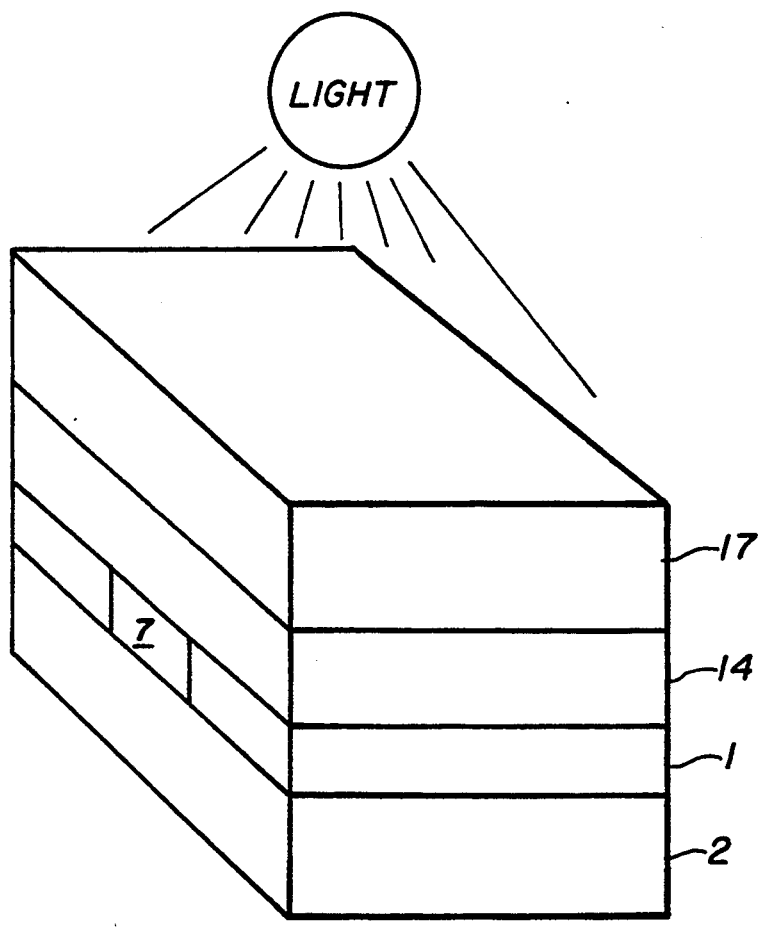
FIG. 5 illustrates an optional step of flooding the element of FIG. 4 with light.

FIG. 5 shows an optional flooding step similar to that illustrated in FIG. 3, except the element being flooded is modified as described in relation to FIG. 4. The element resulting from the first laminating step can be flooded with light, such as broadband ultraviolet light. This polymerizes some of at least one monomer (and typically most or all of one or all of the monomers) in the first layer 14 and further polymerizes some of the at least one monomer in the film 1 (if not already polymerized by a previous flooding step). Extensive crosslinking or polymerization occurs between the monomer(s) of the layer 14 adjacent to the monomer(s) of the film 1 forming a diffuse boundary line or region. The resulting optical waveguide element is also useful in making an optical waveguide device in accordance with this invention.

Figure 6:
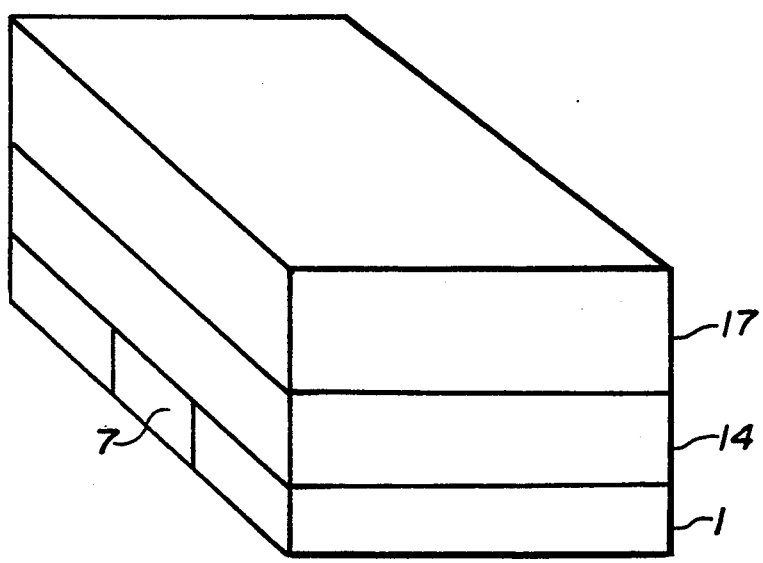
FIG. 6 is the element of FIG. 4 or 5 with one of the supports removed.

FIG. 6 shows the element after the next step of removing the support 2 from the film 1 first surface 3.

Figure 7:
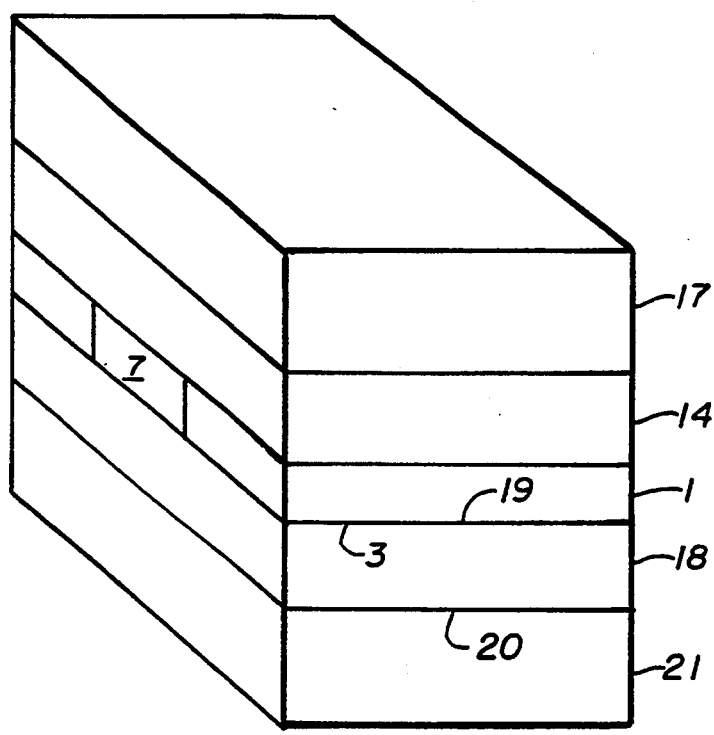
FIG. 7 is a perspective view of an optical waveguide element comprising from top to bottom a support, a photohardenable or photohardened layer, a film having a waveguide, a photohardenable layer, and a support.

Then, referring to FIG. 7, a second substantially dry photohardenable layer 18 is laminated to the film 1 first surface 3. The second layer 18 has first and second surfaces 19 and 20, respectively. The second layer 18 first surface 19 is laminated to the film first surface 3 by placing them in intimate contact and controllably applying pressure with rollers removing air between the film 1 and the second layer 8. The second layer surfaces 19 and 20 are tacky and, thus, easily adhere to the film 1. A support 21 is removably adhered to the second layer second surface 20. Another optical waveguide element results which is useful in making optical waveguide devices.

Figure 8:
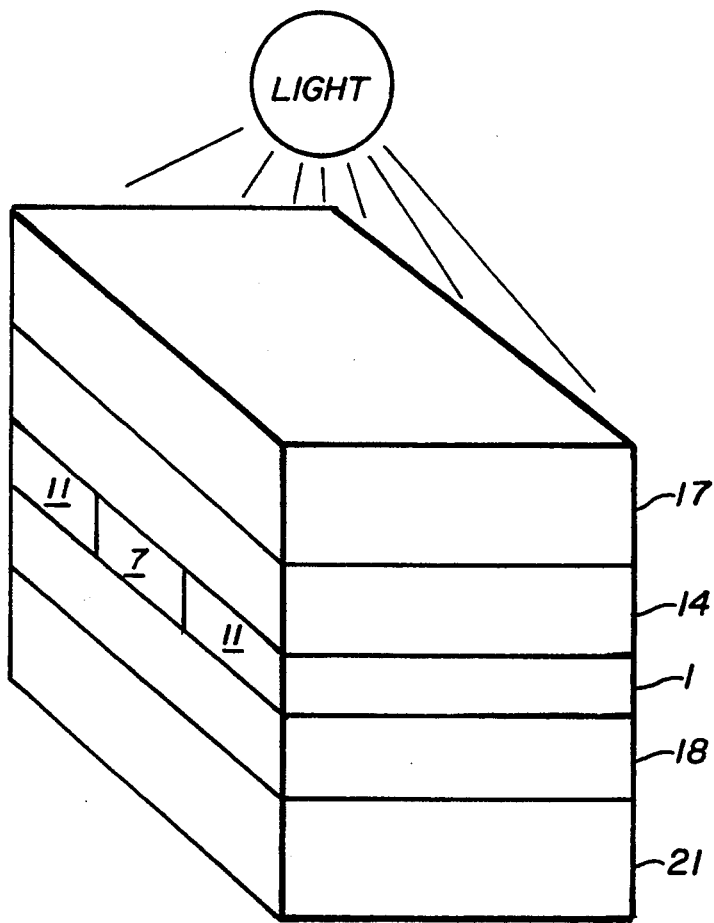
FIG. 8 shows the step of hardening the element of FIG. 7 by flooding it with light.

FIG. 8 illustrates a step of hardening the element depicted in FIG. 7 by flooding it with light, such as broadband ultraviolet light. Throughout this application, the term "broadband ultraviolet light" means light in the spectral region of about 350 through 400 nanometers. This step occurs for minutes, preferably 5, but can last longer. If this is the first flooding step, then this is the first polymerization of at least one monomer (and typically most or all of one or all monomers) in the remaining regions 11 in the film 1 and the first and second layers 14 and 18, respectively. It further polymerizes the at least one monomer in the region 7 of the film 1. If this is not the first flooding step, it polymerizes at least one monomer in the second layer and continues polymerizing the at least one monomer in the rest of the element. Some crosslinking or polymerization occurs between the previously polymerized film 1 and the monomer(s) in the second layer 18 forming a boundary line or region that is more evident than if the film 1 had not previously been flooded with light. Further, if this is not the first flooding step, for instance if buffer layer 14 was previously hardened by flooding it with light as illustrated in FIG. 5, then it would be preferred to harden the film 1 and the buffer layer 18 of the element illustrated in FIG. 8 by flooding light first through support 21, layer 18, film 1, layer 14, and then support 17. In other words, the element should be flooded such that light passes through unhardened layers or films before previously hardened ones. Furthermore, any one or all of the buffer layers and the film with a waveguide formed therein can be hardened by flooding them with light before the layers or film are laminated to the other parts. A device results having at least one buried channel waveguide in a laminated and photohardened matrix useful in integrated optical systems.

Figure 9:
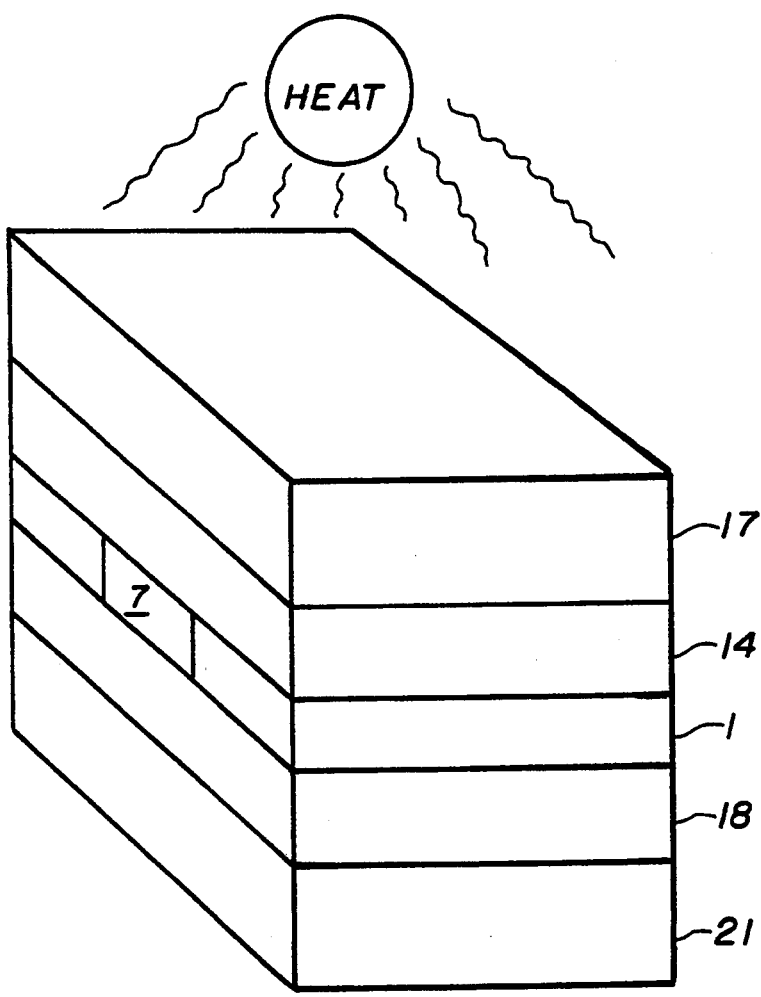
FIG. 9 shows the step of hardening the element of FIG. 7 or the device of FIG. 8 by heating it.

FIG. 9 illustrates another possible step of hardening the element depicted in FIG. 7 by heating it. Actually, the layers and film can be heated before, in combination with, after, or in lieu of the light flooding step to harden or further harden the device. This heating step occurs at a temperature in the range of about 50° C. through 200° C. and preferably in the range of about 100° C. through 150° C. for a duration of minutes, preferably 5.

Photohardenable compositions are typically less sensitive to temperatures up to 100° C. than above 100° C. However, hardening may be initiated as low as 50° C. if held at the temperature for a sufficient period of time. As the temperature is increased beyond 100° C., thermally initiated hardening increases significantly.

After the hardening step, a maximum refractive index increase in the localized waveguide region as measured by an ASUJENA Interphako microscope occurs in the film ] in the range of 0.001 through 0.40 measured at 546 nanometers wavelength. The localized refractive index increase, $\Delta n$, for the purposes of this invention, is derived by conventional shearing interference microscopy techniques and is calculated assuming a uniform index shift through the film such that $\Delta n$ is effectively an average using the following equations:

$$f\lambda = \Delta nd$$
$$f = \frac{a}{b}$$
$$\frac{a\lambda}{b} = \Delta nd$$

where
d = assumed waveguide thickness, typically the film thickness
a = waveguide fringe shift
b = fringe spacing
$\lambda = 0.546\ \mu$, wavelength of light in the microscope.

This localized refractive index increase is contrasted and is not to be confused with a refractive index modulation measured from gratings prepared holographically, such as described in U.S. patent application Ser. No. 07/144,355, filed Jan. 15, 1988.

After the hardening step, the waveguide is transparent in the range of 0.6 through 1.6 micrometers wavelength. It is effectively transparent at 1.3 micrometers for single mode operation.

Also after the hardening step, the maximum refractive index of the matrix except in and near the waveguide is in the range of 1.45 through 1.60 measured at 632 nanometers depending on formulation and/or extent of interlayer diffusion from adjoining layers or film of different indexes. The refractive index is determined by using an ABBE refractometer manufactured by Karl Zeiss.

Figure 10:
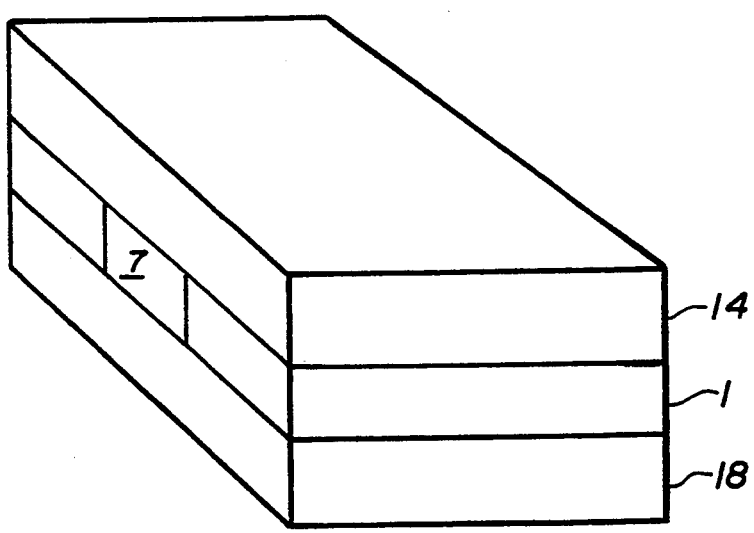
FIG. 10 is a perspective view of an optical waveguide device for use in integrated optical systems, the device comprising from top to bottom a first hardened layer, a hardened film having a waveguide, and a second hardened layer.

The supports 17 and 21 can be removed from the device resulting from the hardening step as shown FIG. 10.

It has been found that a time delay of 5 to 120 minutes, preferably 20 to 30 minutes, after each flooding step and before removal of support sheets and/or subsequent lamination is desirable to facilitate interlayer diffusion and polymerization.

Figure 11:
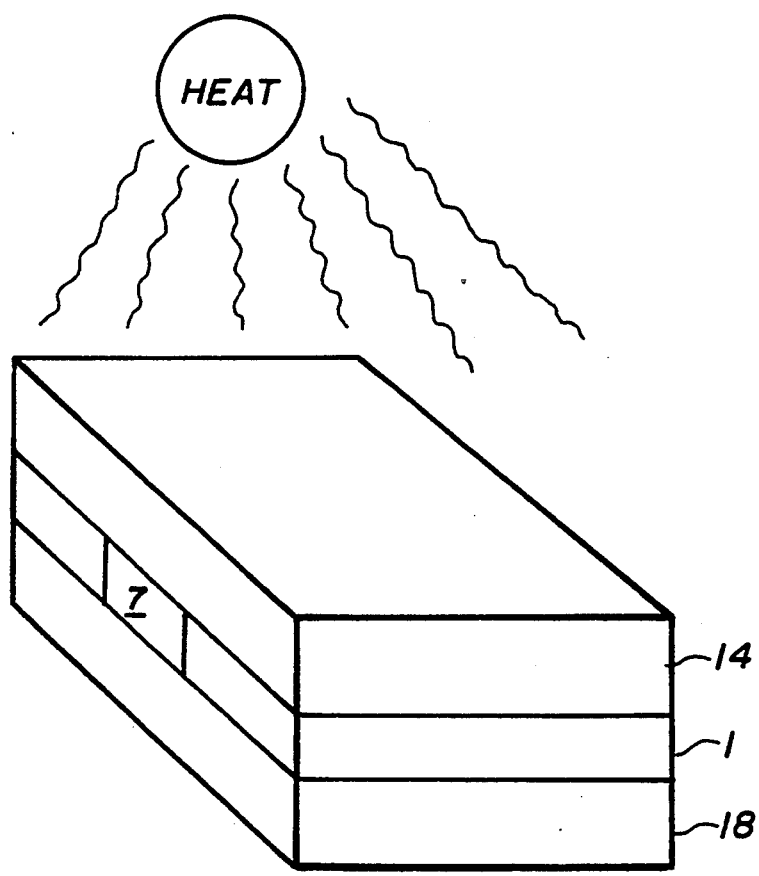
FIG. 11 shows the step of stabilizing the element of FIG. 10 by heating it.

FIG. 11 shows an optional, but preferred, step of stabilizing the device shown in FIG. 10 by heating it, typically after the hardening step. This heating step similarly occurs at a temperature in the range of about 50° C. through 200° C. and preferably in the range of about 100° C. through 150° C. However, this stabilizing step occurs longer than the hardening step. Preferably the stabilizing step occurs in the range of about 30 minutes through 2 hours and more preferably for about an hour. This heating makes the device more environmentally stable ensuring water and other elements in the environment will not interfere with proper operation of the device. Further, this heating provides thermal stabilization of optical and mechanical properties allowing operation of the resulting device over a wide range of temperatures without modification of the device properties.

In the device of FIG. 10 or 11, the first and second layers 14 and 18, respectively, have equal thicknesses. Further, the remaining regions 11 are equal in size and symetric on either side of region 7. As such, the device has a buried channel waveguide that can be dimensioned to easily couple to virtually any optical fiber. FIG. 12 shows the device of either FIG. 10 or 11 coupled to an optical fiber 22. The fiber has a cylindrical core 23 and a cylindrical cladding 24 surrounding the core 23. Standard single mode fiber has a cladding diameter of about 125 microns and a core diameter of about 7 microns. The laminated waveguide device, now clad from above and below, is shown advantageously coupled to the optical fiber 22 simply by abutting the fiber core 23 to the buried waveguide aligning their optical axes. This is accomplished by merely positioning the optical waveguide device adjacent the optical fiber on a flat surface, if the dimensions of the device are preselected for the particular fiber. This aligning can be facilitated by using a film 1 having a thickness which substantially defines one dimension of a substantially rectangular cross section of the waveguide. For coupling to standard single mode fiber, the film thickness should be about 5 to 6 micrometers, preferably 5.3; the exposure width should be about 5 microns; and each one of the first and second layers should be about 59.85 micrometers thick. The total matrix thickness can be made any dimension including about 125, 180 and 200 micrometers.

FIG. 12 also shows the step of injecting light from a light source 25 into and through the optical fiber 22 and buried waveguide.

Figure 13B:
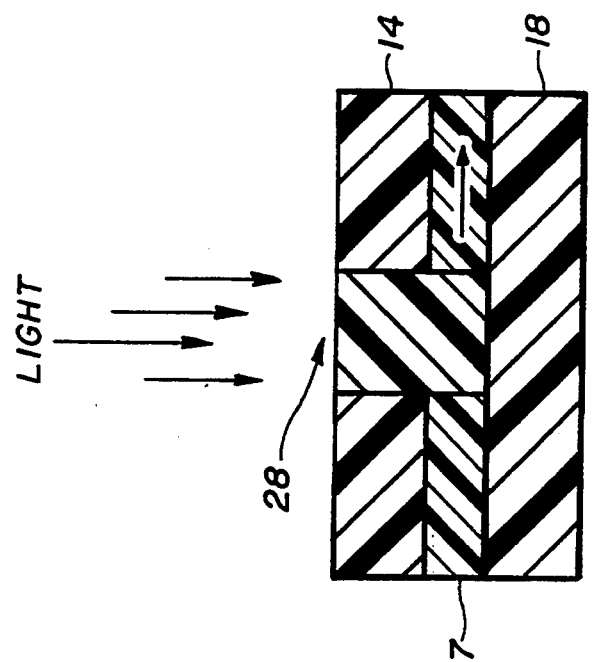
FIG. 13b is a cross sectional representation of a holographically formed grating coupling light to a waveguide buried between layers.
Figure 13A:
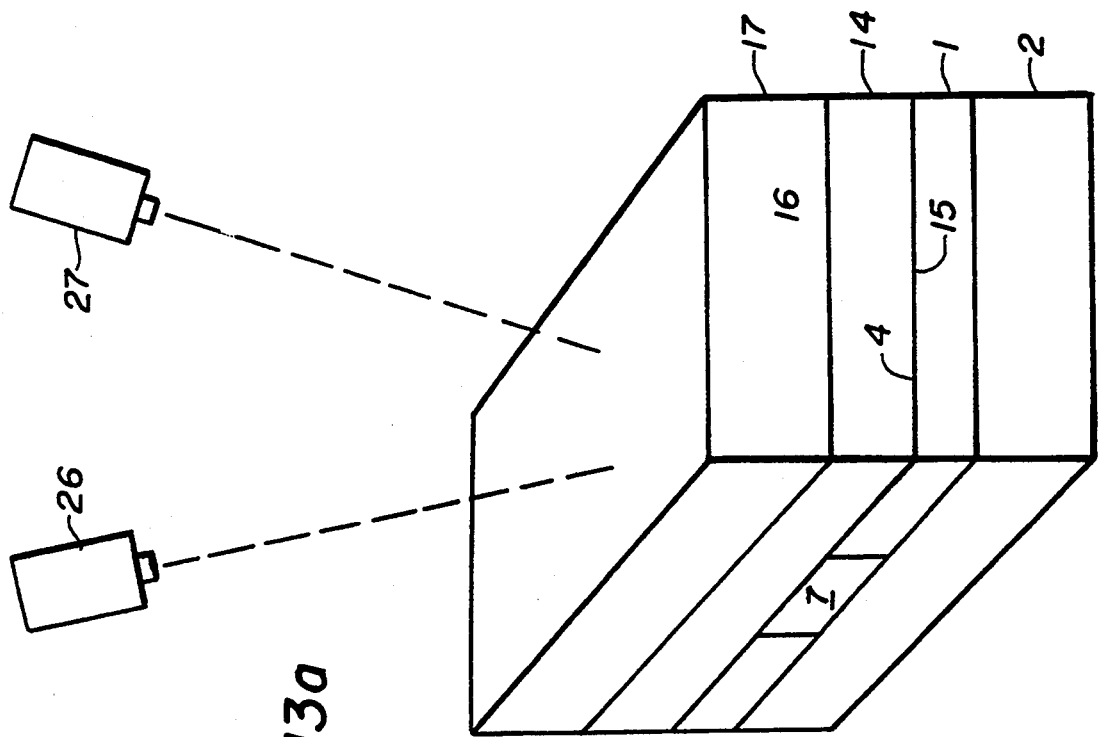
FIG. 13a illustrates directing coherent light within the element of FIG. 4 to produce a holographic diffraction grating.

FIG. 13a illustrates an optional step of directing at least two coherent light beams, such as from lasers 26 and 27 to intersect in an area within the element of FIG. 4. These beams are directed to provide a resultant light intensity that spatially varies in such a way as to produce a holographic diffraction grating 28. More specifically, the grating produced by this process is a volume grating as opposed to a surface grating. A volume grating is three dimensional, rather than planar.

The volume gratings made in accordance with the present invention are high diffraction efficient gratings. This means that the gratings approach or exceed 95% efficiency when the grating spacing is much less than the thickness of the grating. These volume or thick phase diffraction gratings are capable of deflecting or diffracting a narrow range of wavelengths with a narrow angular range with very little light at the center (Bragg angle) wavelength passing through undiffracted.

The grating comprises regions of varying refractive index for input of light to the waveguide or waveguide portion or output of light from the waveguide or waveguide portion. A grating can direct light to or from a waveguide in the film or to or from one of the layers or from a waveguide or waveguide portion in the film (or one of the layers) to another waveguide or waveguide portion within the film (or the one layer). Further, as well known in the art, gratings can be wavelength selective so that they only direct a predetermined range of light wavelengths. Gratings having virtually any dimensions can be formed in accordance with the present invention. Thus, long or thick gratings can be formed for passing narrow ranges or bands of wavelengths where the length that light travels through the grating is about five or more times greater than the grating spacing.

FIG. 13b shows a cross section of the FIG. 10 or 11 device having the holographic diffraction grating 28 in the first layer 14 and the region 7. The grating 28 can be in areas selected from the group consisting of at least part of the region, at least part of one of the layers near the region, and combinations thereof, provided that there has been no previous hardening step for the film and/or layer in which the grating is to be constructed. As an alternative to the method of forming a grating illustrated in FIG. 13a, a similar grating can be formed by directing, before any hardening step, a coherent light beam through a grating at the Bragg angle and then through an area selected from the group consisting of at least part of the region, at least part of one of the layers near the region, and combinations thereof to reproduce or form a holographic diffraction grating in a device. Further, the directing step can be accomplished at other stages of development of the device described herein.

For instance, the directing step can be performed prior to the exposing step, i.e., before the formation of any waveguide. The directing step can be performed subsequent to the exposing step, i.e., after the formation of one or more waveguides. Further, at least one grating can be formed in the same film or layer where one or more waveguides are present. In addition or as an alternative to having at least one grating in the same film or layer where at least one waveguide is present, one or more grating can be formed in one or more layers laminated on either side of a film or layer containing at least one waveguide. A grating can be formed in a layer prior or subsequent to the layer being laminated onto another layer.

A grating can be located and relay light between distinct waveguides in the same or different layers where the waveguides have longitudinal axes that are colinear or non-colinear. A grating can be located at the end of a waveguide, partially or totally coexisting in a volume with a waveguide or adjacent to a side of a waveguide and still direct light into or out of the waveguide.

Diffraction gratings can be placed not only in or between ends of straight waveguides, but they can also be located at a cross-over or intersection, such as of an "X" or "Y" shaped waveguide, whereby light traveling into the crossing region can be diffracted with a selected range of wavelengths passing through the intersection into any predetermined one of the connected branches or back in reverse from the intersection. A device containing an X shaped waveguide with a grating in its intersection can be designed such that the wavelengths for which the grating is not specific will continue straight through the cross-over to continue travel in a waveguide portion having a longitudinal axis that is colinear with the longitudinal axis of the waveguide portion from which the light entered the intersection.

As such, the method, elements and devices of the present invention can be used to create one or more high diffraction efficiency volume phase gratings in a material and permits combining gratings with one or more waveguides in a variety of ways to construct wavelength division multiplexers, devices which combine light of different wavelengths into one transmission channel, or demultiplexers, devices which separate the light into plural light beams of different wavelengths.

One can also arrange diffraction gratings to not only deflect light within waveguides or to deflect light in the layer of the waveguide, but also to deflect light out of a first waveguide in a first layer (e.g., normal or at some angle to the waveguide layer), optionally passing through buffer layers to optical fibers, to other collection means on the outside of the element or device, or into or by another grating in another layer to deflect light into another waveguide removed from the first. Thus, these waveguide and grating combinations can be configured to be input and output couplers in the same layer or in multilayers.

All of the gratings noted above can also be chirped, which means starting with a slightly smaller grating spacing, moving to a slightly longer spacing over a reasonable (e.g., 30–40 microns) length, possibly greater, permitting light with slightly different wavelengths to diffract from different regions of the gratings as the way of compensating for wavelength drift in the laser diode sources. All of these gratings can be produced by the interference of light either directly by interfering laser beams in a holographic sense or indirectly by copying a master grating which has been created holographically. The master grating is laminated to an unexposed portion of the material of interest. One laser light beam call then regenerate both interfering beams in the exposing medium through the master grating. After the copy is made in the material of interest, the master grating is removed.

In addition to using the waveguide grating combinations for wavelength division multiplexing demultiplexing, input/output coupling can be achieved for both sensor devices, as well as interconnects to optical circuits and/or telecommunication devices. These gratings will permit communication from one side of the circuit board to the other side of the circuit board for interconnection to optical emitters, detectors, and electronic components, and similarly, the interconnections between multiple layered waveguides.

One of the advantages of the present invention is the ease of adding one or more substantially dry photohardenable or photohardened layers with or without a waveguide or grating. This versatility is demonstrated in the device illustrated in FIG. 14. This optical waveguide device has exposed regions 7, 29, 31 and 33 in film 1 and layers 14, 30 and 35, respectively. It further shows buffer layers 18, 32, 34 and 36, and a support 21. Region 7 has a holographic diffraction grating to direct light from region 7 to region 29 or the reverse. As an alternative to using a grating to change the direction of light, layer 30 illustrates other techniques, such as one disclosed in U.S. Pat. No. 4,472,020, are possible. Further, the break between layers 34 and 36 is intended to show that devices can have as many or few layers as desired. Of course, waveguides in different layers or in the film and a layer could be formed to exhibit evanescent coupling therebetween.

All layers including those designated by the numbers 14, 18, 30, 32, 34, 35 and 36 can be made out of the same material as the film. Then the hardened device matrix is substantially homogenous in composition and refractive index except in and near the waveguide. Preferably, however, after the hardening step, the waveguide has a refractive index about 0.005 to 0.060 greater than the hardened film and about 0.001 to 0.025 greater than the hardened layers. Of course, regardless of whether different materials are used for different layers and the film, the composition and refractive index in each exposed region is substantially homogenous in composition and refractive index.

The photohardenable film and layers used herein are thermoplastic compositions which upon exposure to actinic radiation form crosslinks or polymers of higher molecular weight to change the refractive index and rhelogical character of the composition(s). Preferred photohardenable materials are photopolymerizable compositions, such as disclosed in U.S. Pat. No. 3,658,526 and more preferred materials are described in commonly assigned U.S. patent application Ser. Nos. 07/144,355, 07/144,281 and 07/144,840, all filed on Jan. 15, 1988, all of which are incorporated herein by reference. In these materials, free radical addition polymerization and crosslinking of a compound containing one or more ethylenically unsaturated groups, usually in a terminal position, hardens and insolublizes the composition. The sensitivity of the photopolymerizable composition is enhanced by the photoinitiating system which may contain a component which sensitizes the composition to practical radiation sources, e.g., visible light. Conventionally a binder is the most significant component of a substantially dry photopolymerizable film or layer in terms of what physical properties the film or layer will have while being used in the invention. The binder serves as a containing medium for the monomer and photoinitiator prior to exposure, provides the base line refractive index, and after exposure contributes to the physical and refractive index characteristics needed for the refractive index image formed. Cohesion, adhesion, flexibility, diffusibility, tensile strength, in addition to index of refraction are some of the many properties which determine if the binder is suitable for use in a refractive index media.

Dry film or layer photohardenable elements contemplated to be equivalent are photodimerizable or photocrosslinkable compositions such as disclosed in U.S. Pat. No. 3,526,504 or those compositions in which hardening is achieved by a mechanism other than the free radical initiated type identified above.

While the photopolymerizable film or layer is a solid sheet of uniform thickness it is composed of three major components, a solid solvent soluble preformed polymeric material, at least one liquid ethylenically unsaturated monomer capable of addition polymerization to produce a polymeric material with a refractive index substantially different from that of the preformed polymeric material, and a photoinitiator system activatable by actinic radiation. Although the film or layer is solid composition, components interdiffuse before, during and after imaging exposure until they are fixed or destroyed by a final uniform treatment usually by a further uniform exposure to actinic radiation. Interdiffusion may be further promoted by incorporation into the composition of an otherwise inactive plasticizer. In addition to the liquid monomer, the composition may contain solid monomer components capable of inter-diffusing in the solid composition and reacting with the liquid monomer to form a copolymer with a refractive index shifted from that of either the preformed polymeric material.

In the preferred compositions for use as the film or layers in this invention, the preformed polymeric material and tile liquid monomer are selected so that either the preformed polymeric material or the monomer contains one or more moieties taken from the group consisting essentially of substituted or unsubstituted phenyl, phenoxy, naphthyl, naphthyloxy and heteroaromatic groups containing one to three aromatic rings and chloro or bromo atoms and wherein the remaining component is substantially free of the specified moieties. In the instance when the monomer contains these moieties, the photopolymerizable system hereinafter is identified as a "Monomer Oriented System" and when the polymeric material contains these moieties, the photopolymerizable system hereinafter is identified as a "Binder Oriented System".

The stable, solid, photopolymerizable compositions preferred for this invention will be more fully described by reference to the "Monomer Oriented System" and "Binder Oriented System".

MONOMER ORIENTED SYSTEM

The monomer of the Monomer Oriented System is a liquid, ethylenically unsaturated compound capable of addition polymerization and having a boiling point above 100° C. The monomer contains either a phenyl, phenoxy, naphthyl, napthoxy or heteroaromatic group containing one to three aromatic rings or a chloro or bromo atom. The monomer contains at least one such moiety and may contain two or more of the same or different moieties of the group, provided the monomer remains liquid. Contemplated as equivalent to the groups are substituted groups where the substitution may be lower alkyl, alkoxy, hydroxy, carboxy, carbonyl, amino, amido, imido or combinations thereof provided the monomer remains liquid and diffusable in the photopolymerizable layer.

Preferred liquid monomers for use in the Monomer Oriented System of this invention are 2-phenoxyethyl acrylate, 2-phenoxyethyl methacrylate, phenol ethoxylate acrylate, 1-(p-chloro phenoxy) ethyl acrylate, p-Chlorophenyl acrylate, phenyl acrylate, 1-phenylethyl acrylate, di(2-acryloxyethyl)ether of bisphenol-A, and 2-(2-naphthyloxy)ethyl acrylate.

While monomers useful in this invention are liquids, they may be used in admixture with a second solid monomer of the same type, e.g., N-vinyl-carbozle, ethylenically unsaturated carbozole monomers such as disclosed in *Journal of Polymer Science: Polymer Chemistry Edition*, Vol. 18, pp. 9–18 (1979) by H. Kamogawa et al, 2-naphthyl acrylate, pentachlorophenyl acrylate, 2,4,6-tribromophenyl acrylate, and bisphenol A diacrylate, 2-(2-naphthyloxy)ethyl acrylate, and N-phenyl maleimide.

The solvent soluble polymeric material or binder of the Monomer Oriented System is substantially free of phenyl, phenoxy, naphthyl, naphthyloxy or heteroaromatic group containing one to three aromatic rings as well as chloro or bromo atoms.

Preferred binders for use in the Monomer Oriented System of this invention are cellulose acetate butyrate polymers; acrylic polymers and inter polymers including polymethyl methacrylate, methyl methacrylate/methacrylic acid and methyl methacrylate/acrylic acid copolymers, terpolymers of methylmethacrylate/C2–C4 alkyl acrylate or methacrylate/acrylic or methacrylic acid; polyvinylacetate; polyvinyl acetal, polyvinyl butyral, polyvinyl formal; and as well as mixtures thereof.

BINDER ORIENTED SYSTEM

The monomer of the Binder Oriented System is a liquid ethylenically unsaturated compound capable of addition polymerization and having a boiling point above 100° C. The monomer is substantially free of moieties taken from the group consisting essentially of phenyl, phenoxy, naphthyl, naphthyloxy or heteroaromatic group containing one to three aromatic rings as well as chloro or bromo atoms.

Preferred liquid monomers for use in Binder Oriented Systems of this invention include decanediol diacrylate, iso-bornyl acrylate, triethylene glycol diacrylate, diethyleneglycol diacrylate, triethylene glycol dimethacrylate, ethoxyethoxyethyl acrylate, triacrylate ester of ethoxylated trimethylolpropane, and 1-vinyl-2-pyrrolidinone.

While monomers used in Binder Oriented Systems are liquids, they may be used in admixture with a second solid monomer of the same type, e.g., N-vinyl-caprolactam.

The solvent soluble polymeric material or binder of the Binder Oriented System contains in its polymeric structure moieties taken from the group consisting essentially of phenyl, phenoxy, naphthyl, naphthyloxy or heteroaromatic group containing one to three aromatic rings as well as chloro or bromo atoms. Contemplated as equivalent to the groups are substituted groups where the substitution may be lower alkyl, alkoxy, hydroxy, carboxy, carbonyl, amido, imido or combinations thereof provided the binder remains solvent soluble and thermoplastic. The moieties may form part of the monomeric units which constitute the polymeric binder or may be grafted onto a preprepared polymer or interpolymer. The binder of this type may be a homopolymer or it may be an interpolymer of two or more separate monomeric units wherein at least one of the monomeric units contains one of the moieties identified above.

Preferred binders for use in the Binder Oriented System include polystyrene, poly (styrene/acrylonitrile), poly(styrene/methyl methacrylate), and polyvinyl benzal as well as admixtures thereof.

The same photoinitiator system activatable by actinic radiation may be used in either the Monomer Oriented System or the Binder Oriented system. Typically the photoinitiator system will contain a photoinitiator and a sensitizer which extends the spectral response into regions having special utility, e.g., the near U.V. region and the visible spectral regions where lasers emit.

Preferred photoinitiators include CDM-HABI, i.e., 2-(o-chlorophenyl)-4,5-bis(m-methoxyphenyl-)imidazole dimer; o-Cl-HABI, i.e., 1,1'-Biimidazole, 2,2'-bis(o-chlorophenyl)-4,4', 5,5'-tetraphenyl-; and TCTM-HABI, i.e., 1H-Imidazole, 2,5-bis(o-chlorophenyl)-4- 3,4-dimethoxyphenyl-, dimer each of which is typically used with a hydrogen donor, e.g., 2-Mercapto benzoxazole.

Preferred sensitizers include the following:
DBC, i.e., Cyclopentanone, 2,5-bis-4-(diethylamino)-2-methylphenyl-methylene);
DEAW, i.e. ; Cyclopentanone, 2,5-bis-((4-(diethylamino)-phenyl )methylene); and Dimethoxy-JDI, i.e., 1H-Inden-1-one, 2,3-dihydro-5,6-dimethoxy-2-((2,3,6,7-tetrahydro-1 H,5H-benzo[i,j]quinolizin-9-yl)methylene)-.

The solid photopolymerizable compositions of this invention may contain a plasticizer. Plasticizers of this invention may be used in amounts varying from about 2% to about 20% by weight of the compositions preferably 5 to 15 wt.%.

Preferred plasticizers for use in simple cellulose acetate butyrate systems are triethyleneglycol dicaprylate, tetraethyleneglycol diheptanoate, diethyl adipate, Brij®30 and tris(2-ethylhexyl)phosphate. Similarly, triethyleneglycol dicaprylate, diethyl adipate, Brij®30, and tris(2-ethylhexyl)phosphate are preferred in "Monomer Oriented Systems" where cellulose acetate butyrate is the binder.

Other components in addition to those described above can be present in the photopolymerizable compositions in varying amounts. Such components include: optical brighteners, ultraviolet radiation absorbing material, thermal stabilizers, hydrogen donors, oxygen scavengers and release agents.

Amounts of ingredients in the photopolymerizable compositions will generally be within the following percentage ranges based on total weight of the photopolymerizable layer: monomer, 5-50%, preferably 15-35%; initiator 0.1-10%, preferably 1-5%; binder, 25-75%, preferably 45-65%; plasticizer, 0-25%, preferably 5-15%; other ingredients 0-5%, preferably 1-4%.

The supports can be any substance transparent to actinic radiation that provides sufficient support to handle the combined film 1 and layer 2. Preferably the support 2 is transparent to light in the spectral region of 0.6 through 1.6 micrometers wavelengths. The term "support" is meant to include natural or synthetic supports, preferably one which is capable of existing in a flexible or rigid film or sheet form. For example, the support or substrate could be a sheet or film of synthetic organic resin, or a composite of two or more materials. Specific substrates include polyethylene terephthalate film, e.g., resin-subbed polyethylene terephthalate film, flame or electrostatic discharge treated polyethylene terephthalate film, glass, cellulose acetate film, and the like. The thickness of the supports has no particular importance so long as it adequately supports the film or layer removeably adhered to it. A support thickness of about 25 to 50 micrometers using polyethylene terephthalate provides sufficient rigidity to a film 6 microns thick.

The following example is provided as an illustration of, but does not limit, the invention.

EXAMPLE 1

A substantially dry photohardenable (active) film of about 5.3 μm thick, having the ingredients listed in Table I, coated on a 25 μm thick clear polyethylene terephthalate support, in approximately a 3 inch×4 inch section, is exposed to broad band ultraviolet light in the spectral range of 350 to 400 nm through a conventional chrome-plated glass photo-mask to produce a 1×4 (one waveguide end to four waveguide ends or four to one) coupler waveguide pattern. After exposure and then an appropriate delay time of about 15 minutes, the mask is removed.

Next, a first substantially dry photohardenable (buffer) layer of about 30 μm thick, having the ingredients listed in Table II, coated on a 25 μm thick clear polyethylene terephthalate support, is laminated to the film surface over the waveguide pattern as shown in FIG. 4. The resultant element is subsequently flooded with broadband ultraviolet light in the spectral range of 350 to 400 nanometers. The film support is then removed by mechanical stripping.

Next, a second photohardenable (buffer) layer of identical composition and structure, as the first buffer layer, with support, is laminated to the opposite surface of the (active) film and flooded as above.

In subsequent steps, the supports attached to the buffer layers are removed. Sequentially, a third and fourth buffer layer of identical composition and structure as the first buffer layer are laminated to the first and second buffer layers, respectively, with flooding between each lamination and subsequent removal of the buffer layer support to form an optical waveguide device having a buried channel waveguide.

The resultant device is heated at 100° C. for 60 minutes to achieve thermal stability.

The indexes of refraction of the film and layers in the laminated device were determined and are listed in Table III.

TABLE I

FILM

| Ingredient | Weight % |
|---|---|
| Cellulose acetate butyrate, Eastman CAB 531-1 | 56.54 |
| 2-Phenoxyethyl acrylate (POEA) | 35.00 |
| Triethyleneglycol dicaprylate (TDC) | 5.00 |
| 2-Mercaptobenzoxazole (MBO) | 1.89 |
| o-Cl-HABI | 1.00 |
| Sensitizing dye (DEAW)[1] | 0.56 |
| 2,6-Di-tert-butyl-4-methylphenol (BHT) | 0.01 |

[1]2,5-Bis([4-(diethylamino)-phenyl]methylene)cyclopentanone

TABLE II

BUFFER LAYER[1]

| Ingredient | Weight % |
|---|---|
| CAB[1] 381-20 | 45.49 |
| POEA[2] | 20.00 |
| N-vinyl carbazole (NVC) | 15.00 |
| Ethoxylated bisphenol A diacrylate, Sartomer 349 | 15.00 |
| o-Cl-HABI[3] | 3.00 |
| 4-Methyl-4H-1,2,4-triazole-3-thiol (MMT) | 1.50 |
| BHT[4] | 0.01 |

[1]Cellulose acetate butyrate
[2]2-Phenoxyethyl acrylate; CAS 48145-04-6
[3]1,1'-Biimidazole, 2,2'-bis-O-chlorophenyl-4,4',5,5'-tetraphenyl; CAS 1707-68-2
[4]2,6-Di-tert-butyl-4-methylphenol

TABLE III

| Layer or Film | REFRACTIVE INDEX |
|---|---|
| Active (non-exposed) Film | 1.535 |
| Waveguide Region of Film | 1.566 Avg. |
| Buffer Layer No. 1 | 1.545 |
| Buffer Layer No. 2 | 1.548 |
| Buffer Layer No. 3 | 1.545 |
| Buffer Layer No. 4 | 1.548 |

The method of the present invention can be used to form or create elements or devices with at least one optical waveguide for guiding light, the waveguide having at least a double peak or bilobal refractive index profile. Preferably, the waveguide has two lobes in its refractive index profile. However, it is within the scope of this invention for the waveguide refractive index profile to have more than two lobes or peaks, such as three, four or more. When bilobal, the bilobal refractive index profile is across a line in a cross sectional area of the waveguide in a plane substantially perpendicular to a longitudinal axis of a length of the waveguide.

Preferably, the at least a bilobal refractive index profile is in an intersection in a waveguide between at least a first portion of a waveguide, each first portion having a respective axis and at least a second portion of the waveguide, each second portion having a respective axis, whereby the axis (axes) of the first portion(s) and the axis (axes) of the second portion(s) are not parallel and define a plane. For instance, the first portion and the second portion can comprise branches of a waveguide having a Y configuration or an X configuration. The waveguide at such intersections is wider than each one of the first portion and the second portion adjacent the intersection. Preferably, the bilobal refractive index profile is in this wider region or volume of the waveguide.

Preferably, the bilobal refractive index profile is in a direction substantially parallel to the plane defined by the axes of the intersecting first and second waveguide portions. Further, the bilobal refractive index profile is preferably substantially normal to at least one of the first and second axes of the first and second waveguide portions.

Also preferably, the dip between the peaks or lobes in the refractive index profile across a device including a waveguide is between about 10% to about 60% of the maximum difference in the refractive index in the profile.

In accordance with the present invention a method of making an optical waveguide having a bilobal refractive index profile comprises exposing to light at least a first region of a photohardenable material, polymerizing at least one monomer in the material and changing the refractive index of the region to form at least a first optical waveguide having a bilobal refractive index profile. During the polymerizing step, some of the at least one monomer in the film adjacent the region being exposed diffuses into the region becoming the waveguide. By controlling this diffusion into the waveguide region during formation of the waveguide, a double peak refractive index profile can be created across the guide.

A bilobal refractive index profile can be made to occur and to be localized near an intersection of branches, such as at a Y-split or X intersection, by adjusting the exposure conditions and the composition of the photopolymerizable material. For instance, diffusion increases with increased temperatures. Thus, in at least the preferred materials of this invention, increasing the temperature during formation of the waveguide increases the diffusion rate and produces waveguides having more smooth and nearly parabolic lobes or refractive index distributions in the refractive index profile. Therefore, controlling the temperature during the exposing step, for instance in the range of from 20° C. to 50° C., controls the refractive index profile.

The refractive index profile can also be controlled by other means. Since the distance a monomer molecule can diffuse depends in some degree on its probability of reaction with a growing polymer chain, diffusion can be controlled by controlling such factors as the waveguide width; the time, intensity, and the intensity distribution of the exposure; the concentration of the photoinitiator system; and the reactivity and functionality of the monomer or monomers. Since diffusion is a function of molecular weight, shape and size, monomer diffusion can be controlled by controlling the molecular weight, shape and size of the monomer or monomers. Diffusion can also be controlled by controlling the viscosity of the monomer or monomers as well as the glass transition point of the binder. Since some of these properties, such as viscosity, also vary with temperature, variation of temperature and some other factor at the same time may produce a complex interaction. Other variables are the time between exposure and final total polymerization and the temperature at which it sits during this time.

In operation, light can propagate in a fundamental mode through each section of the waveguide corresponding to each of the lobes in the profile. Furthermore, there is substantially no power loss of light passing through an intersection of a waveguide with at least a double peak refractive index profile in the intersection other than the loss per unit length of the waveguide without the intersection. In other words, there appears to be virtually no light scattered from the geometric split of the intersection. As a further illustration, when light passes through a first segment of a waveguide including an intersection having input and output branches, each of the branches having a length L, there is a cumulative light power loss comprising the difference between all light power (P1) entering the first segment minus all light power (P2) exiting the first segment that is substantially the same as a power loss through a second segment of the waveguide having length 2L without an intersection when light power entering the second segment is P1.

The refractive index profile of a waveguide device of the present invention can be observed through a shearing interference microscope, such as the Interphako-Pol-D or the Amplival-Pol/Interphako commercially available from aus Jena located in Jena, East Germany.

FIGS. 15a–c illustrate is a conceptual schematic representation of the operation of a shearing interference microscope. Referring to FIG. 15a, there is illustrated an end view of a device 50 of the present invention containing a buried waveguide 52. When operating in a shearing mode, light such as green light having about 520 nanometers wavelength, is passed through the device 50 to a first beam splitter 56. The beam splitter 56 passes half the light straight through to a second beam splitter 58 which also passes half the light straight through to form a first image 60 of the device 50. The light from the device 50 is also reflected by the first beam splitter 56 to a first reflector 62, to a second reflector 64 and then to the second beam splitter 58 which reflects the light to form a second image 70 partially intersecting and tilted with respect to the first image 60. The first image 60 and the second image 70 interfere with one another in such a way that a cross section of the images viewed is indicated by the reference numeral 74. This section shows the first image 62 of the waveguide and the second image 72 of the waveguide 52. Interference fringes 76 appear due to the interfering light of the two images 60 and 70. The shape or profile of the interference fringes 76 are proporational to the difference of the refractive indexes, Δn, across the device 54 from the inside to the outside of the waveguide. More specifically, this relationship is shown by the following equations:

$$f = a/b$$

where f = the fractional fringe shift
a = the difference between the spacing of an interference fringe outside of the waveguide and a point on the fringe inside the waveguide
b = the distance between adjacent interference fringes $$\Delta n = n_2 - n_1 = f\lambda/d$$

where
$\Delta n$ = the difference of the refractive indexes across the device including the waveguide or, in other words, the refractive index across the profile of the device
$n_2$ = the refractive index of the guide
$n_1$ = the refractive index of the device other than the waveguide
f = the fractional fringe shift
$\lambda$ = the wavelength of the light
d = the thickness of the film containing the waveguide which is assumed to be the same as the waveguide film thickness Examples 2-7 below are provided to show the formation of devices illustrating several of the aforesaid principles, the devices being made in accordance with the method of the present invention.

EXAMPLE 2

A substantially dry photohardenable film about 6 micrometers ($\mu$m) thick, having the ingredients listed in Table I, coated onto a 25 $\mu$m thick clear polyethylene terephthalate support, in approximately a 3 inch by 4 inch rectangular section, was exposed to broad band ultraviolet light in the spectral range of 350 to 400 nanometers (nm) through a conventional chrome-plated glass photo-mask to produce a straight waveguide next to a 1×4 (one waveguide input end to four waveguide output ends or four input ends to one output end) coupler waveguide.

After exposing the film through the mask at about 23° C. and an appropriate delay time of about 15 minutes, the mask was removed. This formed an element containing a straight waveguide and a one to four waveguide splitter, the splitter having bilobal refractive index profiles in the enlarged or widened Y configured intersections.

Next a substantially dry photohardenable (buffer) layer of about 30 $\mu$m thick, having the ingredients listed in Table II, coated on a 25 $\mu$m thick clear polyethylene terephthalate support, was laminated to the film surface over the waveguide pattern and then flooded with broadband ultraviolet light as illustrated in FIG. 3. Then the support was stripped from the film as described in Example 1. A second photohardenable (buffer) layer of identical composition and structure as the first buffer layer, with an identical support as the first buffer layer, was laminated to the free surface of the (active) film and flooded with broadband ultraviolet light as described in Example 1. Then the support was stripped from the first layer. A third photohardenable (buffer) layer of identical composition and structure as the first buffer layer, the third layer with an identical support, was laminated to the free surface of the first layer and flooded as described in Example 1. Then the support was stripped from the second layer. A fourth photohardenable (buffer) layer of identical composition and structure as the first buffer layer, the fourth layer with an identical support, was laminated to the free surface of the second layer and flooded as described in Example 1. Removal of the buffer layer supports from the third and fourth layers formed an optical waveguide device having two buried channel waveguides. The resultant device was heated at 100° C. for 60 minutes to achieve thermal stability.

Figure 16:
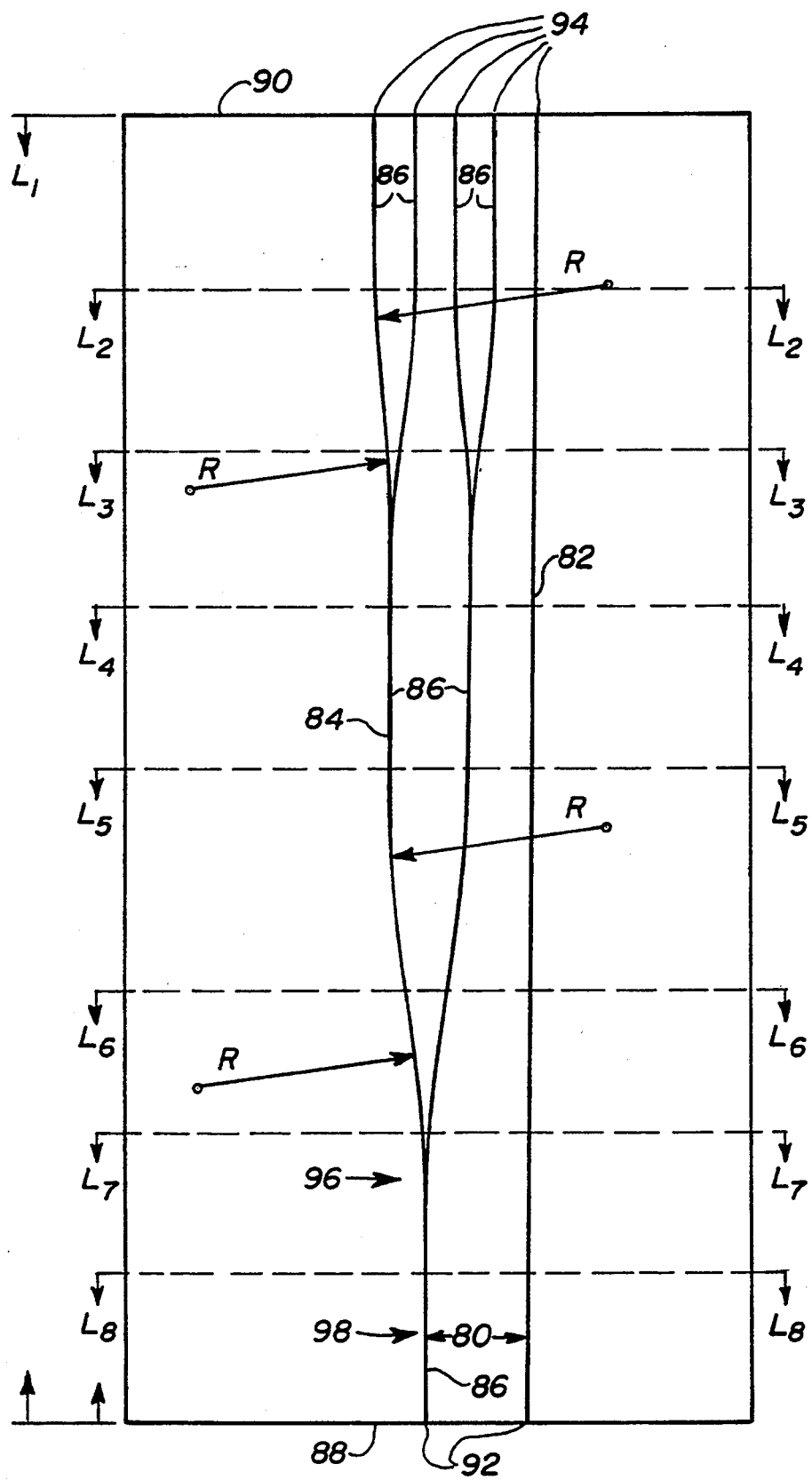
FIG. 16 is a schematic representation of a top view of a device of the present invention as made in Example 2.

FIG. 16 represents a top view of the device made in Example 2. The waveguides 82 and 84 were 5 micrometers wide with radii of curvature, R, of 50 millimeters. Relaxation straights 86, i.e., straight portions of the waveguides between curved portions and at the waveguide ends, are greater than 2 millimeters in length. An input taper was used as part of the input ends of the structure which is not depicted.

Ends 88 and 90 of the device including the waveguides were cut and then polished with colloidal silica for 15 minutes. The length, $L_1$, of the waveguides was measured. The splitter 84 was assumed to be straight in this measurement. A light source was aligned and connected with the input ends 92 of the waveguides 82, 84 and positioned to provide a maximum light intensity out their output ends 94. Single mode 1300 nm wavelength light was introduced into the polished input ends 92 of the waveguides 82, 84 from the light source. The light source was a laser diode directed through a greater than 10 meter length of Sumitomo Z fiber, commercially available from Sumitomo Ltd., Osaka, Japan. Light was collected from the polished output ends 94 of the waveguides 82, 84 with a Nikon 60X lens with a numerical aperture (NA) of 0.7 and focused onto a United Detector Technology (UDT) Germanium detector to measure output power in milliwatts. The device 80 was disconnected from the light source. A length of the output ends of the waveguides was cut off and the new output ends of the device polished as described before. Then the input ends of the waveguides were realigned and reconnected to the light source as before. Light was introduced into the input ends of the waveguides and collected from the output ends as before to measure output power. This process was repeated for eight (8) lengths of the waveguides. The lengths and measured output power are provided in Table IV. The locations where the waveguides were cut are also illustrated in FIG. 16 by the section lines $L_2$—$L_2$, $L_3$—$L_3$, $L_4$—$L_4$, $L_5$—$L_5$, $L_6$—$L_6$, $L_7$—$L_7$, and $L_8$—$L_8$. For each waveguide, eight measurements were taken at various lengths of the guides. For the one to four splitter, there were four output ends for the first three measurements, two output ends for the next four measurements, and one output end for the last measurement.

TABLE IV

| Waveguide Length (Nanometers) | 1 to 4 Splitter (Milliwatts) | | | | | Straight Waveguide |
|---|---|---|---|---|---|---|
| Output: | 1 | 2 | 3 | 4 | Total | (Milliwatts) |
| 31 | 270 | 140 | 800 | 550 | 1760 | |
| 25 | 465 | 230 | 1015 | 728 | 2438 | 2480 |
| 22 | 470 | 270 | 1139 | 741 | 2620 | 2800 |
| 20 | 864 | 2180 | | | 3044 | 3380 |
| 16 | 800 | 2450 | | | 3250 | 3800 |
| 10.5 | 1170 | 3030 | | | 4200 | 4550 |
| 6 | 1900 | 3330 | | | 5230 | 5010 |
| 3 | 5600 | | | | | 5780 |

The data in Table IV shows that the power does not necessarily divide evenly at a Y intersection of juncture. The amount of power going into each upper branch of the Y can be controlled by several means, such as by locating a wavelength selective grating in the juncture.

Figure 17A:
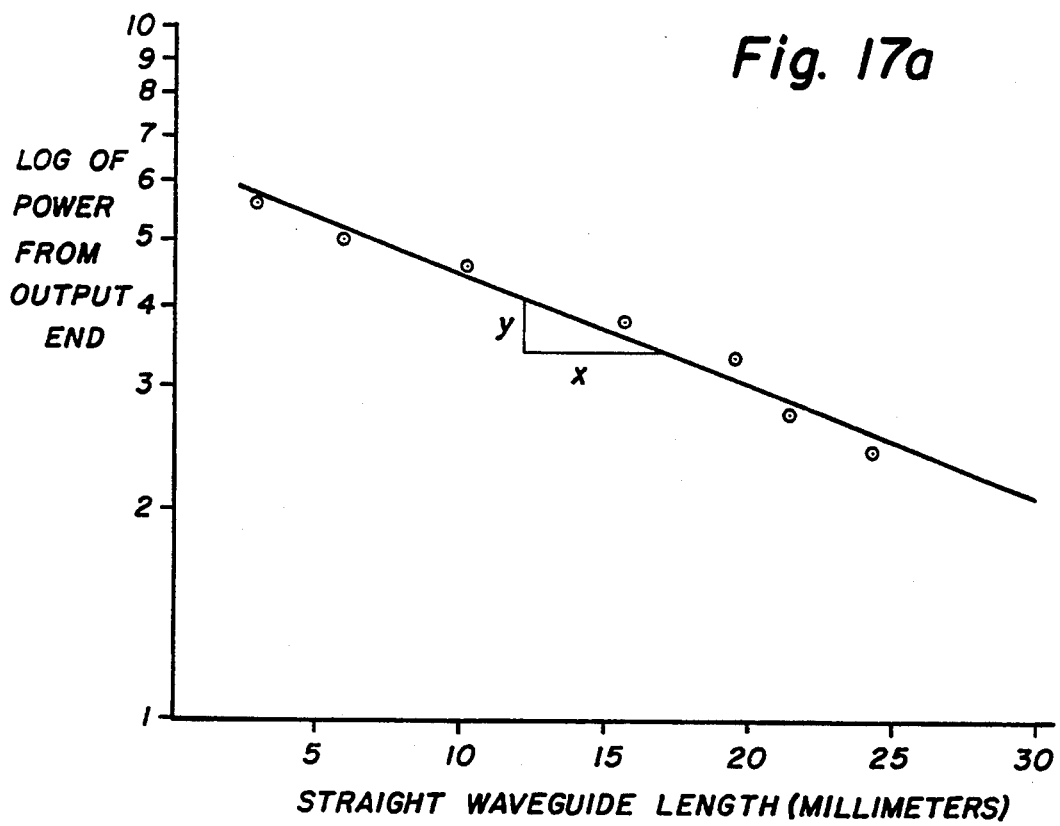
FIG. 17a shows the Log of the power output from a straight waveguide versus the length from an input end of the waveguide.

FIG. 17A shows the Log of the power output from the straight waveguide versus the length of the waveguide. The results are linear indicating that there is uniform loss of power per unit length of the waveguide.

Figure 17B:
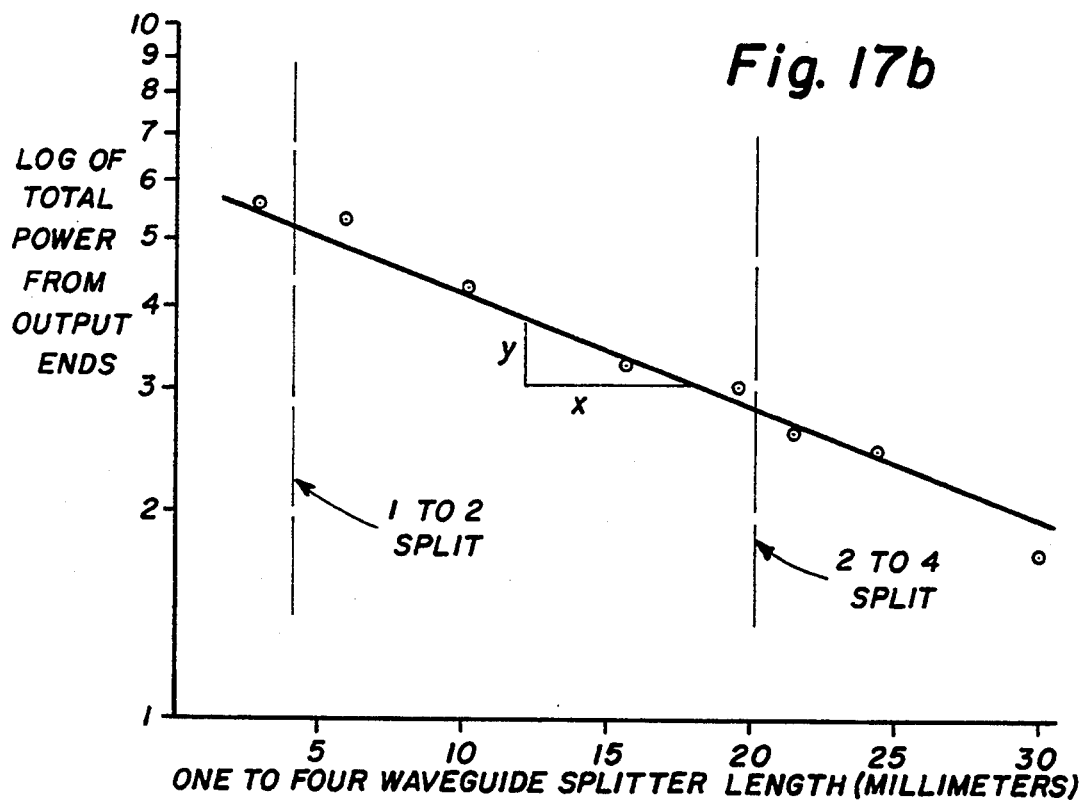
FIG. 17b shows the Log of the power output from a one to four waveguide splitter versus length from an input end of the waveguide.

FIG. 17B shows the Log of the power output from the one to four splitter versus length from the input end of the waveguide. The locations of the Y-branches are indicated by the vertical dashed lines in the Figure. The resulting linear relationship with identical slope as in FIG. 17A indicates that there is no additional power loss when the light passes through the Y-branches. There is virtually no light scattered from the geometric splits of the intersections.

EXAMPLES 3–6

Four more devices were made as described in Example 2 with the same mask or a mask having at least a Y splitter pattern, except the temperature during formation of the waveguides was different in Examples 4–6. In Example 3, the film was exposed through the mask at 23° C. as in Example 2. In Example 4, the film was exposed through the mask at 27° C. In Example 5, the film was exposed through the mask at 30° C. In Example 6, the film was exposed through the mask at 37° C.

The devices were viewed through a shearing microscope, commercially available under the name Amplival-Pol/Interphako from aus Jena with offices in Jena, East Germany. FIGS. 18A–D are reproductions of photographs taken of portions of the images viewed in the microscope. Section A, FIG. 18A shows a length of the one to four waveguide 100 in the Example 3 device, the length includes the apex 102 of the Y split indicated by the number 96 in FIG. 16. Section B of FIG. 18A shows a length of the one to four waveguide in the Example 3 device, time length representative of the waveguide in the straight region designated by the number 98 in FIG. 16. Similarly, Section C of FIG. 18B, section E of FIG. 18C, and section G of FIG. 18C show lengths of the one to four waveguides in the Example 4–6 devices, respectively, the length in each includes the apex of the Y split indicated by the number 96 in FIG. 16. Furthermore, Section D of FIG. 18B, section F of FIG. 18C, and section H of FIG. 18C show a length of the one to four waveguides in the Example 4–6 devices, the length in each representative of the waveguide in the region of the number 98 in FIG. 16.

In Section A of FIG. 18A, interference fringes 104, 106 and 108 show that the change in refractive index, n, across the device (from left to right or right to left) in the wider volume of the Y waveguide split just below the apex 102 has two peaks $P_1$ and $P_2$. Interference fringes 108, 110 and 112 which are above the apex 102 show that each output branch $B_2$ and $B_3$ substantially only has a single refractive index peak, $P_3$, in them. Section B of FIG. 18A shows that the straight portion of the waveguide 114 has two refractive index peaks, $P_4$ and $P_5$, across it.

Section C of FIG. 18B similarly shows interference fringes with two peaks $P_1$ and $P_2$ in the waveguide 102 just below the apex 102 of the Y split. However, the refractive index profile of the straight waveguide portion 124 only has one peak $P_4$, as opposed to two. Thus, increasing the temperature from 23° C. to 27° C. during the exposing step while the waveguide is forming controls the diffusion of at least one monomer into the waveguide region such that the refractive index profile in the straight portion of the waveguide is formed with only one peak. For waveguide portions that are not near intersections such as Y splits, this is preferred.

Section E of FIG. 18C shows that the waveguide 130 just below the apex 102 of the Y splitter has two peaks $P_1$ and $P_2$ that are more rounded or more nearly parabolic than the peaks in the corresponding waveguide volumes shown in Section A of FIG. 18A and Section C of FIG. 18B. Similarly, the waveguide 130 has single peaks $P_3$ in the waveguide branches just above the apex 102 and these peaks $P_3$ are more rounded or parabolic than the peaks in the corresponding waveguide volumes shown in Section A of FIG. 18A and Section C of FIG. 18B. The profile shown in Section of FIG. 18C is preferred over the profiles shown in Section A of FIG. 18A and Section C of FIG. 18B. Further, the refractive index profile of waveguide portion 134 shown in Section F of FIG. 18C has a single lobe $P_4$ that is more rounded or parabolic than the peaks in the corresponding waveguide volumes shown in Section B of FIG. 18A and Section D of FIG. 18B. The profile shown in Section F of FIG. 18C is preferred over the profiles shown in Section B of FIG. 18A and Section D of FIG. 18B.. FIGS. 18B and 18D.

Section G of FIG. 18D also shows a bilobal refractive index profile in the interference fringe just below the apex 102 of the Y waveguide splitter 140. The lower fringes have a single lobe in the waveguide. Whereas, in the Corresponding regions or areas of the waveguides shown in Section A of FIG. 18A, section C of FIG. 18B, and section E of FIG. 18C, the bilobal profile continues farther down the waveguides from the apexes. Section H of FIG. 18D is similar to Section F of FIG. 18C.

Those skilled in the art, having the benefit of the teachings of the present invention as hereinabove set forth, can effect numerous modifications thereto. These modifications are to be construed as being encompassed within the scope of the present invention as set forth in the appended claims.

We claim:

1. An optical waveguide device for use in integrated optical systems comprising:
    a photohardended film having first and second surfaces, the film having a first region and remaining regions, the first region adapted to transmit light as an optical waveguide;
    a first photohardened layer having first and second surfaces, the first layer first surface laminated on the film first surface covering a first side of the waveguide; and
    a second photohardened layer having first and second surfaces, the second layer first surface laminated on the film second surface covering a second side of the waveguide,
    wherein the waveguide is effectively transparent in the spectral region of 0.6 to 16 micrometers.

2. The device as set forth in claim 1, wherein the waveguide comprises a substantially rectangular cross section about 5 by 5.3 micrometers generally orthogonal to the film.

3. The device as set forth in claim 1, wherein the film is about 5.5 micrometers thick.

4. The device as set forth in claim 1, wherein a localized refractive index increase in the range of 0.001 through 0.40 exists between the waveguide and the film remaining regions measured 546 nanometers wavelength by shearing interference microscopy.

5. The device as set forth in claim 1, wherein the waveguide is transparent at 1.3 micrometers for single mode operation.

6. The device as set forth in claim 1, wherein the film remaining regions, the first layer and the second layer are substantially homogenous in composition and refractive index except near the waveguide.

7. The device as set forth in claim 1, wherein the waveguide has a refractive index of about 0.005 to 0.060 greater than the remaining regions and about 0.001 to 0.025 greater than the layers.

8. The device as set forth in claim 1, wherein the maximum refractive index of the film remaining regions, the first layer and the second layer except near the region is in the range of 1.45 through 1.60 measured at 632 nanometers wavelength.

9. The device as set forth in claim 1, wherein the thickness of the film, the first layer and the second layer is selected from the group consisting of about 125, 180 and 200 micrometers.

10. A system for transmitting light comprising the optical waveguide device as set forth in claim 1 and a single mode optical fiber coupled to the device with optical axes in alignment.

11. The device as set forth in claim 1, wherein the waveguide substantially has a Y configuration.

12. The device as set forth in claim 1, wherein the waveguide has one end adapted to inlet or outlet light connected to a plurality of ends adapted to inlet or outlet light.

13. The device as set forth in claim 1, further comprising at least a second waveguide in part parallel to the first waveguide such that the waveguides exhibit evanescent coupling of light injected into the first waveguide by gradually leaking or coupling the injected light into the second waveguide.

14. The device as set forth in claim 1, further comprising a holographic diffraction grating comprising areas of varying refractive indexes in a space selected from the group consisting of at least part of the first region, at least part of one of the layers near the region, and combinations thereof to direct light.

15. The device of claim 14, wherein the grating is a volume phase grating.

16. The device of claim 15, further comprising a second waveguide, the grating positioned to relay light from the first waveguide to the second waveguide.

17. The device of claim 16, wherein longitudinal axes of the first waveguide and the second waveguide are colinear and the grating is between the waveguides.

18. The device of claim 16, wherein longitudinal axes of the first waveguide and the second waveguide are not colinear.

19. The device of claim 16, wherein the grating is positioned at an end of one of the waveguides.

20. The device as set forth in claim 1, further comprising:
a support removably adhered to the first layer second surface; and
a support removably adhered to the second layer second surface.

21. An optical waveguide element for use in forming optical devices comprising:
a film having first and second surfaces, the film having a first photohardened region adapted to transmit light as an optical waveguide and substantially dry photohardenable remaining regions; and
a support removably adhered to the first surface.

22. The element as set forth in claim 21, further comprising:
a first substantially dry photohardenable layer having first and second surfaces, the first layer first surface laminated to the film second surface; and
a support removably adhered to the first layer second surface.

23. An optical waveguide element for use in forming optical waveguide devices comprising:
a photohardened film having first and second substantially flat surfaces, the film having a first region and remaining regions, the first region adapted to transmit light as an optical waveguide; and
a support removably adhered to the first surface.

24. The device as set forth in claim 1, wherein:
the film comprises
(a) a solvent soluble binder,
(b) at least one liquid ethylenically unsaturated monomer capable of addition polymerization, and
(c) a photoinitiator system activatable by the actinic radiation.

25. The device as set forth in claim 1, wherein:
at least one of the layers comprises
(a) a solvent soluble binder,
(b) at least one liquid ethylenically unsaturated monomer capable of addition polymerization, and
(c) a photoinitiator system activatable by the actinic radiation.

26. The element as set forth in claim 21, wherein:
the film comprises
(a) a solvent soluble binder,
(b) at least one liquid ethylenically unsaturated monomer capable of addition polymerization, and
(c) a photoinitiator system activatable by the actinic radiation.

27. The element as set forth in claim 23, wherein:
the film comprises
(a) a solvent binder,
(b) at least one liquid ethylenically unsaturated monomer capable of addition polymerization, and
(c) a photoinitiator system activatable by the actinic radiation.

28. The device as set forth in claim 25, wherein either said unsaturated monomer or said binder contains one or more moiety selected from the group consisting of (1) substituted or unsubstituted phenyl, phenoxy, naphthyl, naphthyloxy, and heteroaromatic groups containing up to three aromatic rings; (2) chloro; and (3) bromo, and wherein the other of said unsaturated monomer and said binder is substantially free of said moiety.

29. The device as set for in claim 28, wherein said monomer contains said moiety and said binder is substantially free of said moiety.

30. The element as set forth in claim 26, wherein either said unsaturated monomer or said binder contains one or more moiety selected from the group consisting of (1) substituted or unsubstituted phenyl, phenoxy, naphthyl, naphthyloxy, and heteroaromatic groups containing up to three aromatic rings; (2) chloro; and (3) bromo, and wherein the other of said unsaturated monomer and said binder is substantially free of said moiety.

31. The element as set forth in claim 30, wherein said monomer contains said moiety and said binder is substantially free of said moiety.

* * * * *